United States Patent
Nakayama et al.

(10) Patent No.: US 6,194,915 B1
(45) Date of Patent: Feb. 27, 2001

(54) SEMICONDUCTOR INTEGRATED CIRCUIT DEVICE AND PROCESS FOR MANUFACTURING THE SAME

(75) Inventors: Michiaki Nakayama, Ome; Masato Hamamoto, Iruma; Kazutaka Mori, Kodaira; Satoru Isomura, Hamura, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/077,829

(22) PCT Filed: Nov. 27, 1996

(86) PCT No.: PCT/JP96/03469

§ 371 Date: Jun. 4, 1998

§ 102(e) Date: Jun. 4, 1998

(87) PCT Pub. No.: WO97/21247

PCT Pub. Date: Dec. 6, 1997

(30) Foreign Application Priority Data

Dec. 4, 1995 (JP) .................................................. 7-315459

(51) Int. Cl.[7] .................................................. H01L 27/04
(52) U.S. Cl. .............................. 326/121; 326/31; 326/83; 327/534
(58) Field of Search .................... 326/33, 34, 31, 326/83, 86, 121; 327/534, 535

(56) References Cited

U.S. PATENT DOCUMENTS

| 5,557,231 | * | 9/1996 | Yamaguchi et al. | 327/534 |
| 5,610,533 | * | 3/1997 | Arimoto et al. | 326/33 |
| 5,793,691 | * | 8/1998 | Mullarkey | 326/33 |

FOREIGN PATENT DOCUMENTS

| 6-334010 | 12/1994 | (JP) . |
| 7-235608 | 9/1995 | (JP) . |
| 8-17183 | 1/1996 | (JP) . |

OTHER PUBLICATIONS

T. Kuroda, et al. "Low Power & Communication Signal Processing", *IEEE International Solid–State Circuits Conference*, Paper Nos. FA 10.2 and FA 10.3, pp. 166, 167 and 437, (1996).

T. Kuroda, et al. "A High–Speed Low–Power 0.3μm CMOS Gate Array with Variable Threshold Voltage (VT) Scheme", IEEE Custom Integrated Circuits Conference, pp. 53–56, (1996).

W. Maly, "Chapter 5: CMOS Technology", *Zusetsu Cho Eruesuai Kogaku (Illustrated ULSI Engineering* in English), pp. 167–191 (in Japanese with English translation).

* cited by examiner

Primary Examiner—Michael Tokar
Assistant Examiner—Don Phu Le
(74) Attorney, Agent, or Firm—Antonelli, Terry, Stout & Kraus, LLP

(57) ABSTRACT

To provide a semiconductor integrated circuit having a CMOS circuit constituted by electrically connecting an n-type well 2, in which one transistor Tp for constituting the CMOS circuit is set, with a first power-supply-voltage line Vdd through a switching transistor Tps, and electrically connecting a p-type well 3 in which the other transistor Tn for constituting the CMOS circuit is set with a second power-supply-voltage line Vss through a switching transistor Tns. Moreover, the semiconductor integrated circuit is constituted so that thermal runaway due to leakage current can be controlled by turning off the switching transistors Tps and Tns and supplying a potential suitable for a test to the n-type well 2 and the p-type well 3 from an external unit when the semiconductor integrated circuit is being tested. Furthermore, the semiconductor integrated circuit is constituted so that fluctuations of the latch-up phenomenon and operation speed can be prevented by turning on the switching transistors Tps and Tns and setting the n-type well 2 and the p-type well 3 to the power supply voltages Vdd and Vss, respectively.

13 Claims, 22 Drawing Sheets

|  | NORMAL STATE | AGING LEAK CURRENT TEST |
|---|---|---|
| $V_{wl}$ | $V_{dd}$ | $V_{dd} + \Delta V_{BB}$ |
| $V_{su}$ | $V_{ss}$ | $V_{ss} - \Delta V_{BB}$ |
| $C_{wl}$ | $V_{ss}$ | $V_{wl}(V_{dd}+\Delta V_{BB})$ |
| $C_{su}$ | $V_{dd}$ | $V_{su}(V_{ss}-\Delta V_{BB})$ |

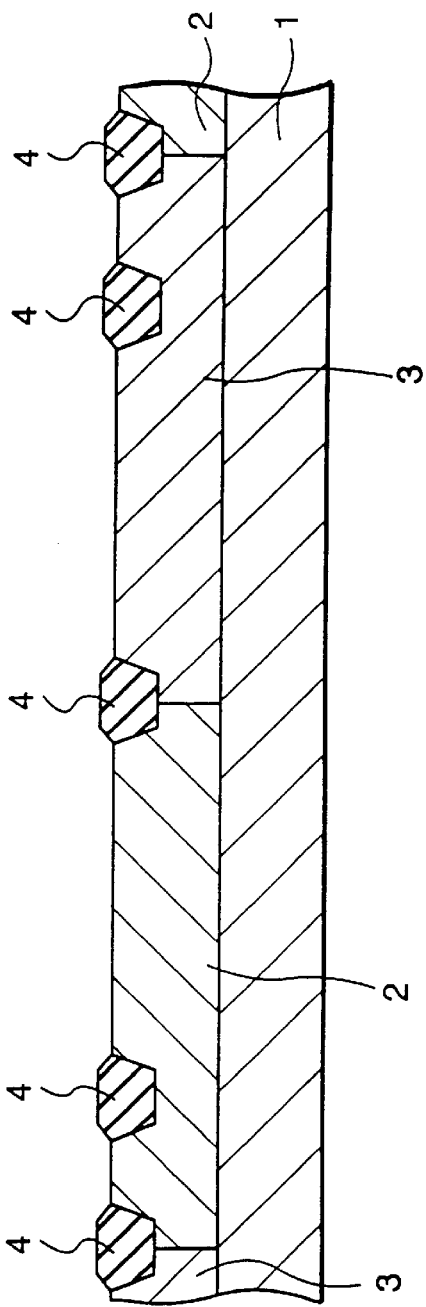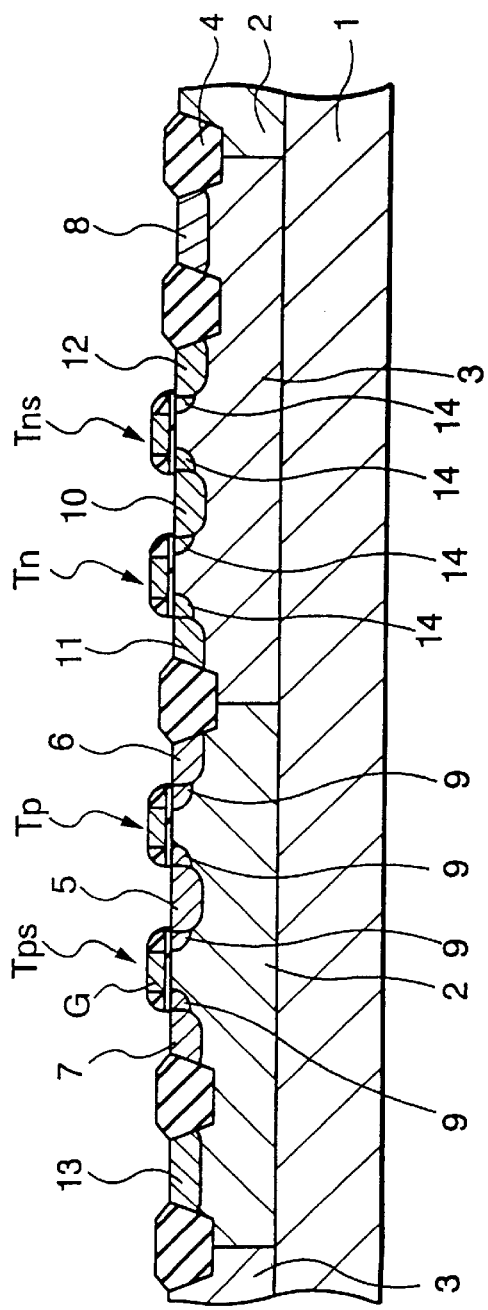

SEMICONDUCTOR INTEGRATED CIRCUIT DEVICE AND PROCESS FOR MANUFACTURING THE SAME

TECHNICAL FIELD

The present invention relates to a semiconductor integrated circuit and its fabrication art, particularly to an art effectively applied to a semiconductor integrated circuit having a CMIS (Complimentary Metal Insulator Semiconductor).

BACKGROUND ART

In recent years, various studies have been made for a semiconductor integrated circuit because of high integration, acceleration, and low power consumption. Particularly, in the case of a semiconductor integrated circuit having a MOS FET (Metal Oxide Semiconductor Field Effect Transistor), it is necessary to further fine devices and wirings in order to improve the device integration degree and the operation speed and, therefore, scaling of a device size is rapidly progressed.

The present inventor studied scaling of a semiconductor integrated circuit. The following is an art studied by the present inventor and its outline is described below.

That is, scaling of a semiconductor integrated circuit such as an LSI (Large Scale Integrated Circuit) includes two types—constant-voltage scaling and constant-electric-field scaling.

In the case of a CMOS semiconductor integrated circuit including a CMOS FET as a component, the constant-electric-field scaling is mainly executed from the viewpoint of securing the reliability of a gate oxide film. In this case, it is also necessary to lower a power supply voltage proportionally to reduction of a device size from the viewpoint of securing the stability of a device characteristic.

The literature on the fabrication art for a CMOS semiconductor integrated circuit is shown, for example, in W. MALY "ZUSETSU CHO ERUESUAI KOGAKU (transliterated)", pp. 167–191, issued by KEIGAKU SHUPPAN (transliterated) Co., Ltd. on Dec. 15, 1990. An original text of the above-transliterated literature is "Atlas of IC Technologies: An Introduction to VLSI Processes" by W. Maly (Copyright© 1987 by The Benjamin/Cummings Publishing Company Inc.).

In the case of the above CMOS semiconductor integrated circuit, to make a scaling rule practically effective, it is necessary to lower a threshold voltage proportionally to a device size. This is because a voltage component contributing to a circuit operation can be shown by the expression of "power supply voltage–threshold voltage".

However, because lowering of a threshold voltage causes increase of leak current, a leak current test (I ddq test) widely used for the test of a semiconductor integrated circuit cannot be executed and, moreover, in the case of an aging test, temperature is extremely raised due to increase of the leak current and thereby, a problem of causing thermal runaway occurs.

FIG. 29 shows the mechanism of thermal runaway in the case of an aging test. In FIG. 29, x-axis shows the set junction temperature (junction temperature Tj1) of a semiconductor integrated circuit and y-axis shows the temperature (junction temperature Tj2) obtained by adding a temperature rise due to the total leak current of a semiconductor integrated circuit produced due to the junction temperature Tj1 to an ambient temperature. Normally, the junction temperature Tj2 and the junction temperature Tj1 are stabilized at an equal temperature. However, when a leak current component increases, temperature is extremely raised due to the leak current and resultingly, thermal runaway occurs.

By applying a back bias to the well of a MOS FET in order to solve the above problem, it is possible to consider a technique for controlling a threshold voltage.

In the case of this technique, however, the well potential may fluctuate due to noises under practical use (under normal operation) and a problem may occur in which a forward current is applied between the well and the source/drain to cause the latch-up phenomenon.

Moreover, the art for decreasing a leak current by using the back bias is described in, for example, the official gazette of Japanese Patent Laid-Open No. 6-334010/1994 which discloses a structure in which the substrate node of a low-threshold-voltage field effect transistor constituting a group of logic circuits to a power supply line and a dummy power supply line connected to the group of logic circuits to a power supply line through a high-threshold-voltage field effect transistor.

In the case of this art, the field effect transistor whose substrate node is connected to the power supply line can perform normal operation at a low threshold voltage by turning on the high-threshold-voltage transistor under the normal operation of a semiconductor integrated circuit while the low-threshold-voltage field effect transistor can temporarily have a high threshold voltage by turning off the high-threshold-voltage field effect transistor and applying a test voltage to the dummy power supply line.

However, this art has a problem that the circuit impedance increases and thereby, the general operation speed of the semiconductor integrated circuit lowers because the high-threshold-voltage field effect transistor is set between the group of logic circuits and the power supply in series.

Moreover, the official gazette of Japanese Patent Laid-Open No. 8-17183/1996 discloses an art of using switching means for making the substrate potential of a MOS FET variable as an art for controlling the threshold voltage of the MOS FET. This art makes it possible to switch the switching characteristic and the sub-threshold current characteristic because switching means switches the back gate bias of the MOS FET to first or second potential and absolute values of the threshold voltage of the MOS FET.

In the case of this art, however, the source and n-well of a p-channel MOS FET are short-circuited each other through an n-channel MOS FET. Therefore, problems occur that (1) it is necessary to generate a voltage higher than a power supply voltage under normal operation and (2) device characteristics are deteriorated because the high voltage in the above Item (1) is applied to the MOS FET and thereby, the thickness of the gate oxide film of the MOS FET must be increased.

It is an object of the present invention to provide a high-performance CMOS semiconductor integrated circuit capable of preventing the latch-up phenomenon and its fabrication art.

Moreover, it is another object of the present invention to provide an art capable of preventing the latch-up phenomenon of a CMOS semiconductor integrated circuit from occurring under the normal operation of the semiconductor integrated circuit and a leak current from being generated under the test of the circuit.

Furthermore, it is still another object of the present invention to provide an art capable of improving the reliability of a CMOS semiconductor integrated circuit under the normal operation and test without lowering the operation speed of the semiconductor integrated circuit under the normal operation of the circuit.

Furthermore, it is still another object of the present invention to provide an art capable of improving the reliability of a CMOS semiconductor integrated circuit under the normal operation and test of the circuit without deteriorating device characteristics.

The above and other objects and novel characteristic of the present invention will become more apparent from the following description when taken in conjunction with the accompanying drawings.

DISCLOSURE OF THE INVENTION

That is, a semiconductor integrated circuit of the present invention has a first power-supply-voltage line connected to a CMOS FET and a second power-supply-voltage line to which a voltage lower than that of the first power-supply-voltage line is applied and moreover has a third power-supply-voltage line and a fourth power-supply-voltage line independently of the first and the second power-supply-voltage lines, and makes it possible to supply power to a first-conducting-type well through the third power-supply-voltage line according to necessity and a second-conducting-type well through the fourth power-supply-voltage line according to necessity.

Moreover, in the case of a semiconductor integrated circuit of the present invention, a first switching transistor having a MOS FET is connected between a first power-supply-voltage line and a third power-supply-voltage line, and a second switching transistor having a MOS FET is connected between a second power-supply-voltage line and a fourth power-supply-voltage line, and makes it possible to short-circuit the first power-supply-voltage line and the third power-supply-voltage line by operating the first switching transistor according to necessity, and short-circuit the second power-supply-voltage line and the fourth power-supply-voltage line by operating the second switching transistor according to necessity.

Thereby, under the normal operation of a semiconductor integrated circuit, for example, it is possible to control the fluctuation of substrate potentials of first- and second-conducting-type MOS FETs by turning on first- and second-switching transistors and supplying first and second power-supply voltages to first- and second-conducting-type wells. Therefore, it is possible to prevent the latch-up phenomenon due to the fluctuation.

Moreover, under the test of a semiconductor integrated circuit, for example, it is possible to decrease a leak current by turning off first and second switching transistors and applying a voltage suitable for the test to first- and second-conducting-type wells from third and fourth power-supply-voltage lines. Therefore, it is possible to control thermal runaway due to the leak current.

Furthermore, a semiconductor integrated circuit fabrication method of the present invention comprises the steps of:
  forming first- and second-conducting-type wells on the surface of a semiconductor substrate;
  forming a second-conducting-type MOS FET for constituting a CMOS FET and a first switching transistor having a MOS FET different from the second-conducting-type MOS FET in the first-conducting-type well;
  forming a first-conducting-type MOS FET for constituting a CMOS FET and a second switching transistor having a MOS FET different from the first-conducting-type MOS FET;
  forming a first power-supply-voltage line so as to be connected with the source of the second-conducting-type MOS FET for constituting the CMOS FET;
  forming a second power-supply-voltage line so as to be connected with the source of the first-conducting-type MOS FET for constituting the CMOS FET;
  forming a well feeding line so as to be connected with the drain of the first switching transistor and the first-conducting-type well;
  forming a well feeding line so as to be connected with the drain of the second switching transistor and the second-conducting-type well;
  forming a control signal line so as to be connected with the gate electrode of the first switching transistor; and
  forming a control signal line so as to be connected with the gate electrode of the second switching transistor; wherein
  the first switching transistor is set adjacently to the source of the second-conducting-type MOS FET in the same semiconductor region and the second switching transistor is set adjacently to the source of the first-conducting-type MOS FET in the same semiconductor region.

Thereby, it is possible to decrease the areas occupied by the first and the second switching transistors and thus, it is possible to improve the efficiency of layout.

Furthermore, a semiconductor integrated circuit fabrication method of the present invention comprises the steps of:
  forming a first-conducting-type well and a second-conducting-type well on the surface of a semiconductor substrate;
  forming a second-conducting-type MOS FET for constituting a CMOS FET in the first-conducting-type well and a first switching transistor having a MOS FET different from the second-conducting-type MOS FET;
  forming a first-conducting-type MOS FET for constituting a CMOS FET and a second switching transistor having a MOS FET different from the first-conducting-type MOS FET;
  forming a first power-supply-voltage line so as to be connected with the source of the second-conducting-type MOS FET for constituting the CMOS FET;
  forming a second power-supply-voltage line so as to be connected with the source of the first-conducting-type MOS FET for constituting the CMOS FET;
  forming a well feeding line so as to be connected with the drain of the first switching transistor and the first-conducting-type well;
  forming a well feeding line so as to be connected with the drain of the second switching transistor and the second-conducting-type well;
  forming a control signal line so as to be connected with the gate electrode of the first switching transistor; and
  forming a control signal line so as to be connected with the gate electrode of the second switching transistor; wherein
  the step of forming the well feeding line so as to be connected with the drain of the first switching transistor and the first-conducting-type well and the step of forming the well feeding line so as to be connected with the drain of the second switching transistor and the second-conducting-type well are performed in the same step, and the step of forming the control signal line so as to be connected with the gate electrode of the first switching transistor and the step of forming the control signal line so as to be connected with the gate electrode of the second switching transistor are performed in the same step.

Thereby, by forming a first switching transistor, its well feeding line, and its control signal line and a second switching transistor, its well feeding line, and its control signal line in the same step, it is possible to fabricate a semiconductor integrated circuit having the first switching transistor, the second switching transistor, the well feeding lines, and the control signal lines.

Moreover, a semiconductor integrated circuit of the present invention is fabricated by providing a set of the first and second switching transistors for a plurality of logic gates respectively. Thereby, it is possible to decrease the entire switching-transistor occupied area compared to the case of providing a first switching transistor and a second switching transistor for each logic gate. Therefore, it is possible to prevent a chip size from increasing due to addition of switching transistors and a device integration degree from decreasing.

Furthermore, a semiconductor integrated circuit of the present invention is fabricated by constituting the third power-supply-voltage line and the fourth power-supply-voltage line with a conductor wiring, providing a connecting portion for connecting a conductor wiring for the third power-supply-voltage line with the first-conducting-type well, and providing a connecting portion for connecting a conductor wiring for the fourth power-supply-voltage line with the second-conducting-type well for each cell region to which each of the logic gates is set.

Thereby, because a well feeding voltage can be supplied from the vicinity of each logic gate, it is possible to stably supply a potential to each logic gate.

Moreover, a semiconductor integrated circuit of the present invention is fabricated by providing a switching control section for dividing a control signal in a control signal line into two control signals having a potential different from each other and transmitting each divided control signal to each of the first and the second switching transistors for the front stages of inputs of the first and the second switching transistors. Thereby, it is possible to turn on/off the switching transistors by one control signal line.

Furthermore, a semiconductor integrated circuit of the present invention is fabricated by providing the first switching transistor and the second switching transistor for a space area in which power-supply-voltage lines are arranged.

Thereby, because of providing switching transistors for the power-supply-voltage line arranging area which is originally a space area, it is possible to effectively use the principal plane of a semiconductor chip and prevent the area from increasing compared to the case of providing switching transistors for an area other than the wiring arranging area.

BRIEF DESCRIPTION OF THE DRAWINGS

FIG. 6 is a schematic sectional view showing a fabrication step of the semiconductor integrated circuit of an embodiment of the present invention;

FIG. 7 is a schematic sectional view showing a fabrication step of the semiconductor integrated circuit of an embodiment of the present invention;

BEST MODE FOR CARRYING OUT THE INVENTION

The present invention is described below in detail in accordance with the accompanying drawings. In all drawings for explaining embodiments, components having the same function are provided with the same symbol and their repetitive explanation is omitted.

The CMOS semiconductor integrated circuit of the embodiment is specifically described by referring to FIGS. 1 to 5.

Figure 1:
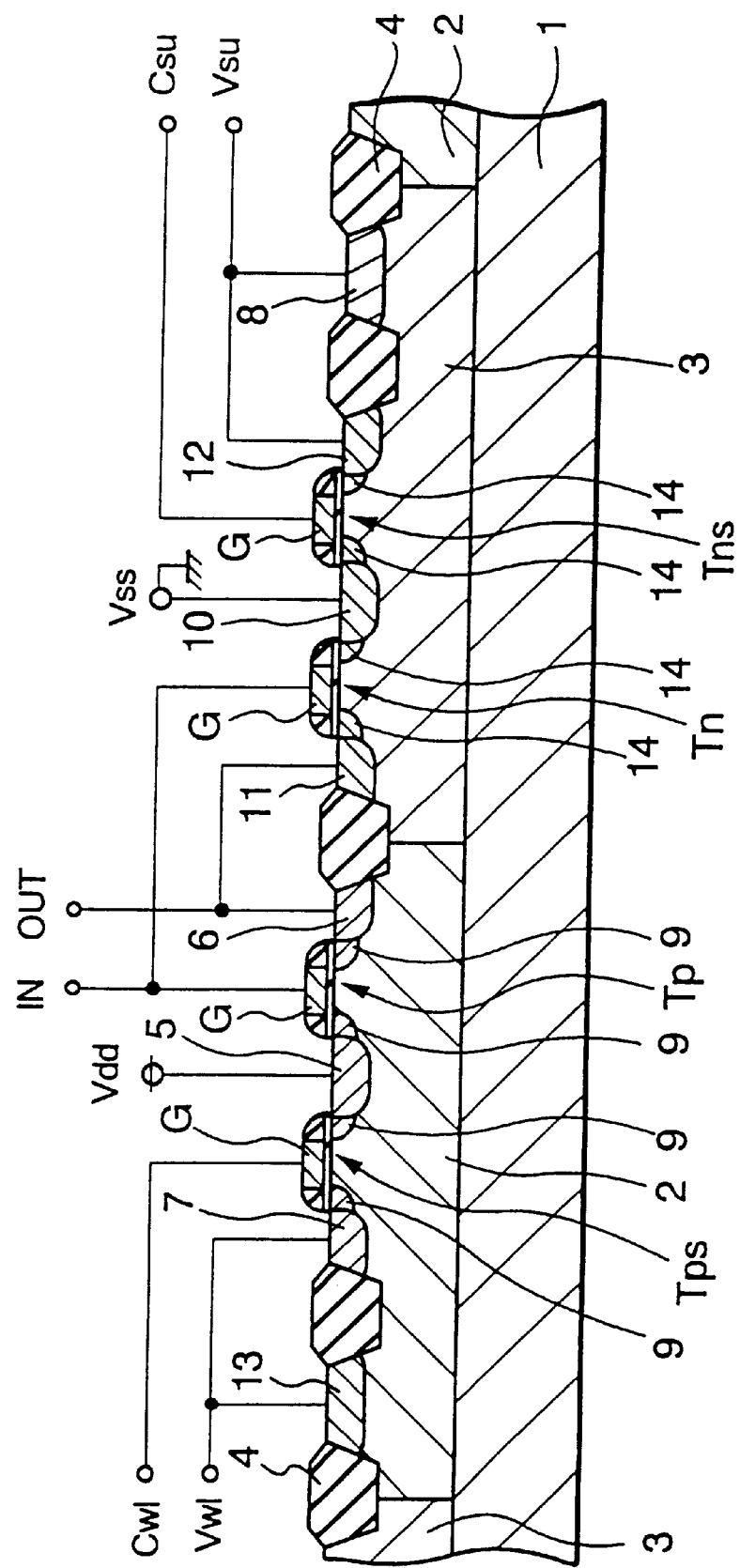
FIG. 1 is a schematic sectional view showing the CMOS semiconductor integrated circuit of an embodiment of the present invention.
Figure 2:
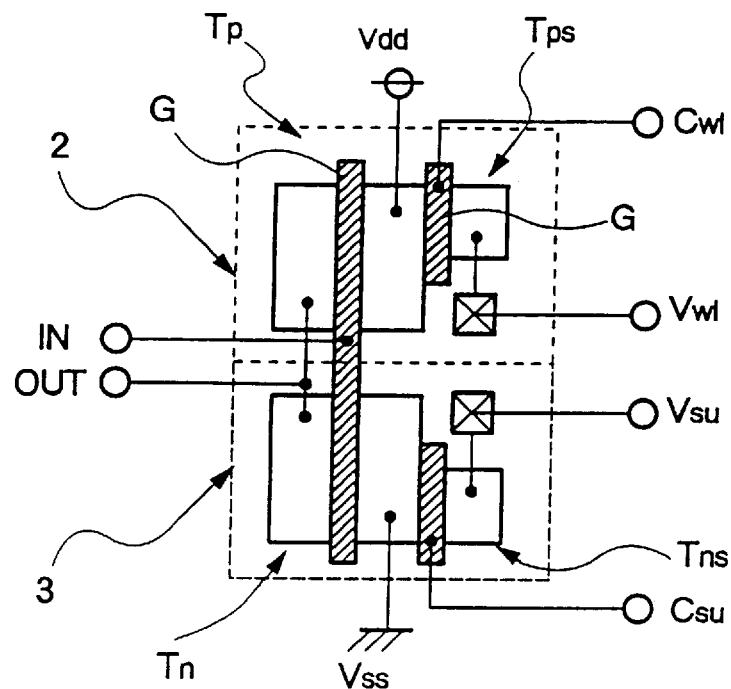
FIG. 2 is a schematic layout diagram showing the CMOS semiconductor integrated circuit of an embodiment of the present invention.
Figure 3:
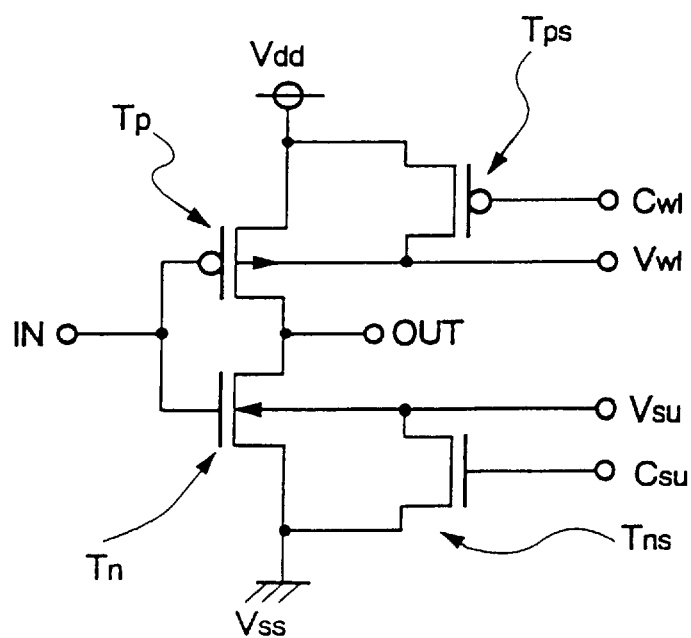
FIG. 3 is a schematic circuit diagram showing the CMOS semiconductor integrated circuit of an embodiment of the present invention.

FIGS. 1 to 3 show the region of an inverter used for the logic gate of the CMOS semiconductor integrated circuit of this embodiment.

Moreover, in this specification, a symbol such as Vdd is used for a case of showing a voltage which is a general indication and a case of showing a wiring to which the voltage is applied. Moreover, in FIGS. 1 to 3, a circular mark denotes an electrode such as a pin provided for an end of each wiring and a square provided with hatching x denotes a contact region connecting different wiring layers, that is, the region of a through-hole conductive layer embedded in a through-hole.

Moreover, the schematic sectional view of FIG. 1 showing the CMOS semiconductor integrated circuit of this embodiment has a mode in which various sectional regions in the schematic layout diagram showing the CMOS semiconductor integrated circuit of this embodiment shown in FIG. 2 are connected in order to make the illustration and description clear.

In the case of the CMOS semiconductor integrated circuit of this embodiment, an n-type well 2 and a p-type well 3 are formed on a p-type semiconductor substrate 1.

Moreover, a field insulating film 4 is formed on the boundary between the n-type well 2 and the p-type well 3 on the surface of the p-type semiconductor substrate 1.

The n-type well 2 is provided with the transistor Tp of a p-channel MOS FET serving as a component of an inverter circuit and a p-channel MOS FET serving as a switching transistor Tps which is a feature of this embodiment. The source 5 of the switching transistor Tps and the source 5 of the transistor Tp for the inverter circuit are adjacently arranged in the same p-type semiconductor region.

Moreover, the p-type well 3 is provided with the transistor Tn of an n-channel MOS FET which is a component of the inverter circuit and an n-channel MOS FET serving as a switching transistor Tns which is a feature of this embodiment. The source of the source 10 of the switching transistor Tns and the source 10 of the transistor Tn for the inverter circuit are adjacently arranged in the same n-type semiconductor region.

Furthermore, a p-type semiconductor region 9 having a concentration lower than the concentrations of the source 5 and the drain 6 which are high-concentration p-type semiconductor regions of the transistor Tp of a p-channel MOS FET for constituting a CMOS FET and the source 5 and the drain 7 which are high-concentration p-type semiconductor regions of the switching transistor Tps is formed on the source 5 and the drain 6 of the transistor Tp and the source 5 and the drain 7 of the transistor Tps in the n-type well 2 and serves as a MOS FET having the LDD (Lightly Doped Drain) structure.

Furthermore, an n-type semiconductor region 14 having a concentration lower than the concentrations of the source 10 and the drain 11 which are high-concentration n-type semiconductor regions of the transistor Tn of an n-channel MOS FET for constituting a CMOS FET and the source 10 and the drain 12 which are high-concentration n-type semiconductor regions of the switching transistor Tns of an n-channel MOS FET for constituting a CMOS FET is formed on the source 10 and the drain 11 of the transistor Tn and the source 10 and the drain 12 of the transistor Tns in the p-type well 3 and serves as a MOS FET having the LDD structure.

Furthermore, the source 5 of the transistor Tp connects with a first power-supply-voltage line Vdd to which a power supply voltage Vdd of, for example, approx. 5 V is applied, its gate electrode G connects with an input line IN, and its drain 6 connects with an output line OUT.

The source 10 of the transistor Tn connects with a second power-supply-voltage line (source line) Vss to which a power supply voltage Vss of, for example, 0 V (ground voltage) (under a potential state lower than that of the first power-supply-voltage line), its gate electrode G connects with an input line IN, and its drain 11 connects with an output line OUT.

Moreover, a control signal line Cw1 to which a control signal Cw1 is supplied is connected to the gate electrode G of the switching transistor Tps in order to control the transistor Tps.

Furthermore, the n-type well 2 connects with a well feeding line Vw1 to which a well feeding voltage Vw1 is applied through an n-type semiconductor region 13 and the well feeding line Vw1 connects with the drain 7 of the switching transistor Tps.

Furthermore, a control signal line Csu to which a control signal Csu is supplied is connected to the gate electrode G of the switching transistor Tns in order to control the transistor Tns.

Furthermore, the p-type well 3 connects with a well feeding line Vsu to which a well feeding voltage Vsu is applied through a p-type semiconductor region 8 and the well feeding line Vsu is connected to the drain 12 of the switching transistor Tns. In this case, because the p-type well 3 and the p-type semiconductor substrate 1 have the same conducting type, the well feeding line Vsu is brought into a mode of the substrate feeding line of the p-type semiconductor substrate 1.

In the case of the CMOS semiconductor integrated circuit of the above embodiment, the n-type well 2 is newly provided with the switching transistor Tps and the p-type well 3 is newly provided with the switching transistor Tns.

Moreover, the control signal line Cw1 is newly connected to the gate electrode G of the switching transistor Tps and the well feeding line Vw1 is newly connected to the drain 7 of the transistor Tps in order to control the transistor Tps.

Furthermore, the control signal line Csu is newly connected to the gate electrode G of the switching transistor Tns and the well feeding line Vsu is newly connected to the drain 12 of the transistor Tns in order to control the transistor Tns.

Therefore, the threshold voltage Vthp of the p-channel MOS FET in the n-type well 2 and the threshold voltage Vthn of the n-channel MOS FET in the p-type well 3 can be controlled to desired values by adjusting the well feeding lines Vw1 and Vsu.

That is, a change value $\Delta Vthp$ of the threshold voltage of the p-channel MOS FET in the n-type well 2 can be controlled by adjusting the well feeding line Vw1 in accordance with an expression of $$\Delta Vthp = KBP\{(Vw1-Vdd+2\Phi F)^{1/2} - (2\Phi F)^{1/2}\}.$$

Moreover, the threshold voltage $\Delta Vthn$ of the n-channel MOS FET in the p-type well 3 can be controlled by adjusting the well feeding line Vsu in accordance with an expression of $\Delta Vthn = KBN\{(Vss-Vsu+2\Phi F)^{1/2}-(2\Phi F)^{1/2}\}$.

In the above expressions, KBP denotes the substrate effect constant of a p-channel MOS FET, KBN denotes the substrate effect constant of an n-channel MOS FET, and $\Phi F$ denotes the built-in potential of a semiconductor.

Figures 4, 5:
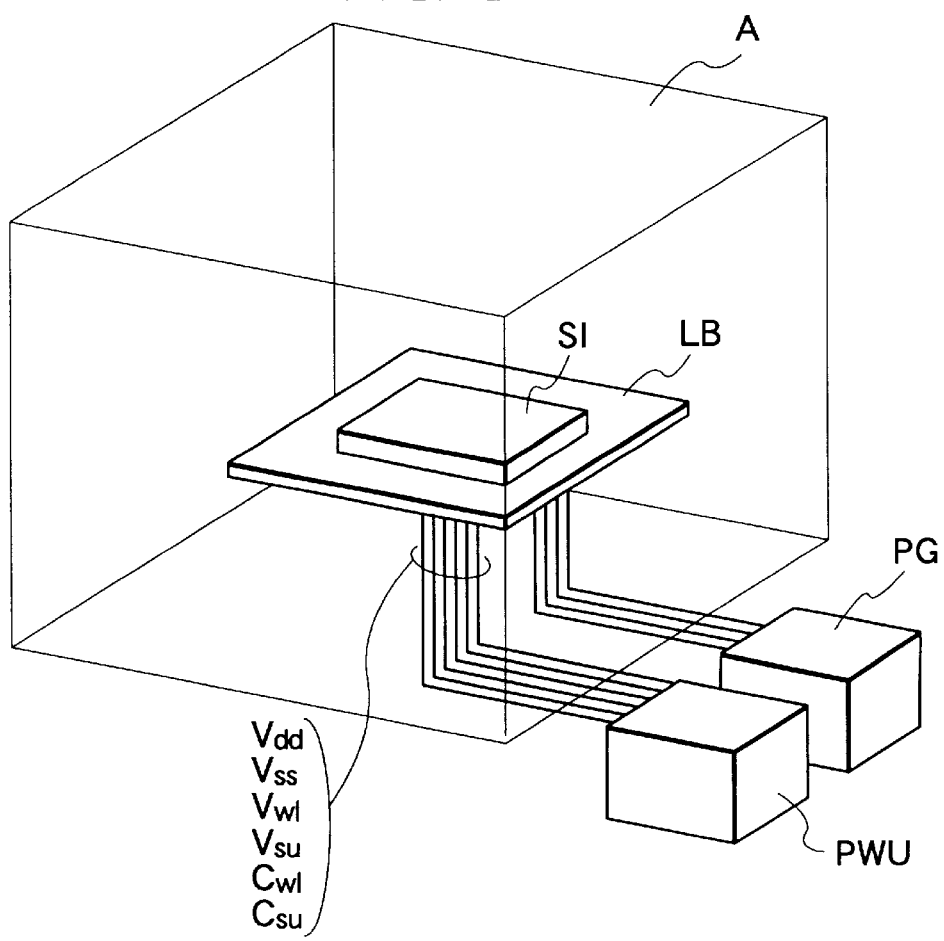
FIG. 4 is an illustration showing potentials to be applied to a well feeding line and a control signal line under the normal operation and test of the semiconductor integrated circuit in FIG. 1.
FIG. 5 is an illustration of an aging tester for explaining an aging test.

FIG. 4 shows voltages to be applied to the well feeding lines Vw1 and Vsu and the control signal lines Cw1 and Csu under the aging test and normal operation of the semiconductor integrated circuit of this embodiment. In FIG. 4, VBB denotes a positive predetermined reference voltage.

First, under the aging test, the switching transistors Tps and Tns are turned off by applying Vw1(Vdd+$\Delta$VBB) and VSu(Vss–$\Delta$VBB) to the control signal lines Cw1 and Csu respectively. Then, voltages Vdd+$\Delta$VBB and Vss–$\Delta$VBB are applied to the well feeding lines Vw1 and Vsu from an external unit respectively. Thereby, it is possible to avoid the problem of lead current under the aging test and moreover, avoid the problem of thermal runaway due to the leak current.

Under the normal operation, the switching transistors Tps and Tns are turned on by applying power supply voltages Vss and Vdd to the control signal lines Cw1 and Csu respectively. Thereby, the power-supply-voltage lines Vdd and Vss are electrically connected with the well feeding lines Vw1 and Vsu to set the substrate potentials of the transistors Tp and Tn to the power supply voltages Vdd and Vss respectively. Thereby, because fluctuation of substrate potentials of the transistors Tp and Tn can be controlled, it is possible to prevent the latch-up phenomenon and the fluctuation of operation speed due to the fluctuation of the substrate potentials and secure the operational reliability of a semiconductor integrated circuit.

Thus, in the case of the CMOS semiconductor integrated circuit of this embodiment, to bring the switching transistor Tps formed in the n-type well 2 and the switching transistor Tns formed in the p-type well 3 into the off state, that is, the unconnected state, the voltage of the control signal line Cw1 for controlling the switching transistor Tps is equalized with the first power supply voltage Vdd and the voltage of the control signal line Csu for controlling the switching transistor Tns is equalized with the second power supply voltage Vss.

Therefore, according to the CMOS semiconductor integrated circuit of this embodiment, it is possible to set the potentials of the n-type well 2 and the p-type well 3 independently of those of the first power-supply-voltage line Vdd and the second power-supply-voltage line Vss by bringing the switching transistor Tps formed in the n-type well 2 and the switching transistor Tns formed in the p-type well 3 into the off-state, that is, the unconnected state under the leak current test and aging test. Thus, it is possible to perform a test under the normal state by controlling leak current.

Moreover, according to the CMOS semiconductor integrated circuit of this embodiment, it is possible to perform the normal operation under a state in which the latch-up phenomenon is prevented by bringing the switching transistor Tps formed in the n-type well 2 and the switching transistor Tns formed in the p-type well 3 into the on-state, that is, connected state under the normal operation when the leak current test or aging test is not performed.

Furthermore, according to the CMOS semiconductor integrated circuit of this embodiment, it is possible to control the threshold voltage of a MOS FET and prevent the latch-up phenomenon from occurring because a back bias can be supplied to the n-type well 2 and the p-type well 3 according to necessity. Therefore, it is possible to constitute a high-performance and high-reliability semiconductor integrated circuit.

Furthermore, according to the CMOS semiconductor integrated circuit of this embodiment, it is possible to control the threshold voltage of a MOS FET and short-circuit a power supply system necessary for circuit operations and a power supply system independent of the former power supply system through the switching transistors Tps and Tns according to necessity, because the n-type well 2 and the p-type well 3 are provided with the control signal line Cw1, the well feeding line Vw1, the control signal line Csu, and the well feeding line Vsu of which the first power-supply-voltage line Vdd to which the power supply voltage Vdd necessary for circuit operations and the second power-supply-voltage line Vss to which the power supply voltage Vss is applied are mutually independent.

Thus, according to the CMOS semiconductor integrated circuit of this embodiment, it is possible to prevent the latch-up phenomenon under the leak current test, the aging test, and the normal operation. Therefore, it is possible to constitute a high-performance high-reliability semiconductor integrated circuit.

FIG. 5 schematically shows a state of the above aging test. One CMOS semiconductor integrated circuit SI or more is or are mounted on a wiring substrate LB for aging and set in an aging oven A.

A power supply unit PWU is a component section for supplying the power supply voltages Vdd and Vss, well feeding voltages Vw1 and Vsu, and well feeding control signals Cw1 and Csu to the semiconductor integrated circuit SI.

A pattern generator PG is a component section for generating a pulse signal and performing a test by supplying the pulse signal to the semiconductor integrated circuit SI and thereby activating circuits inside of the semiconductor integrated circuit SI.

To start the aging test, the initial failure of the semiconductor integrated circuit SI is screened by setting the temperature in the aging oven A in which the semiconductor integrated circuit SI is stored to a predetermined value and thereafter, keeping the state for a certain period.

The art for fabricating the CMOS semiconductor integrated circuit of this embodiment is described below by referring to FIGS. 6 to 9.

FIGS. 6 to 9 are schematic sectional views showing the steps of fabricating the CMOS semiconductor integrated circuit of this embodiment.

First, as shown in FIG. 6, a p-type semiconductor substrate 1 is prepared, an n-type well 2 and a p-type well 3 are formed on the surface of the p-type semiconductor substrate 1 by the ion implantation method, and then a field insulating film 4 made of, for example, a silicon oxide film on a selective region of the surface.

Then, as shown in FIG. 7, a transistor Tp of a p-channel MOS FET for constituting a CMOS FET and a p-channel MOS FET serving as a switching transistor Tps which is a feature of this embodiment are formed in the n-type well 2 in the same step.

Moreover, a transistor Tn of an n-channel MOS FET for constituting a CMOS FET and a switching transistor Tns which is a feature of this embodiment are formed in the p-type well 3 in the same step.

In this case, a gate insulating film is formed at the lower side of the gate electrode G of each of the above various MOS FETs and a side-wall insulating film is formed on the side wall of the gate electrode G.

Moreover, a p-type semiconductor region 8 is formed on the source 5 and the drain 7 of the switching transistor Tps and the p-type well 3 in the n-type well 2 at the same time in the step same as the step of forming the source 5 and the drain 6 serving as high-concentration p-type semiconductor regions of the transistor Tp of a p-channel MOS FET for constituting a CMOS FET by the ion implantation method.

Furthermore, the source 5 of the transistor Tp and the source 5 of the switching transistor Tps are adjacently arranged in the same high-concentration p-type semiconductor region.

Furthermore, a p-type semiconductor region 9 having a concentration lower than that of the high-concentration p-type semiconductor region is formed in the high-concentration p-type semiconductor region as a MOS FET having an LDD (Lightly Doped Drain) structure.

Furthermore, the source 10 and the drain 12 of the switching transistor Tns are formed in the p-type well 3 in the step same as the step of forming the source 10 and the drain 11 serving as high-concentration n-type semiconductor regions of the transistor Tn of an n-channel MOS FET for constituting a CMOS FET by the ion implantation method and moreover, an n-type semiconductor region 13 is formed in the n-type well 2 at the same time.

Furthermore, the source 10 of the transistor Tn and the source 10 of the switching transistor Tns are adjacently arranged in the same high-concentration n-type semiconductor region.

Furthermore, an n-type semiconductor region 14 having a concentration lower than that of the high-concentration n-type semiconductor region is formed in the n-type semiconductor region as a MOS FET having the LDD structure.

Figure 8:
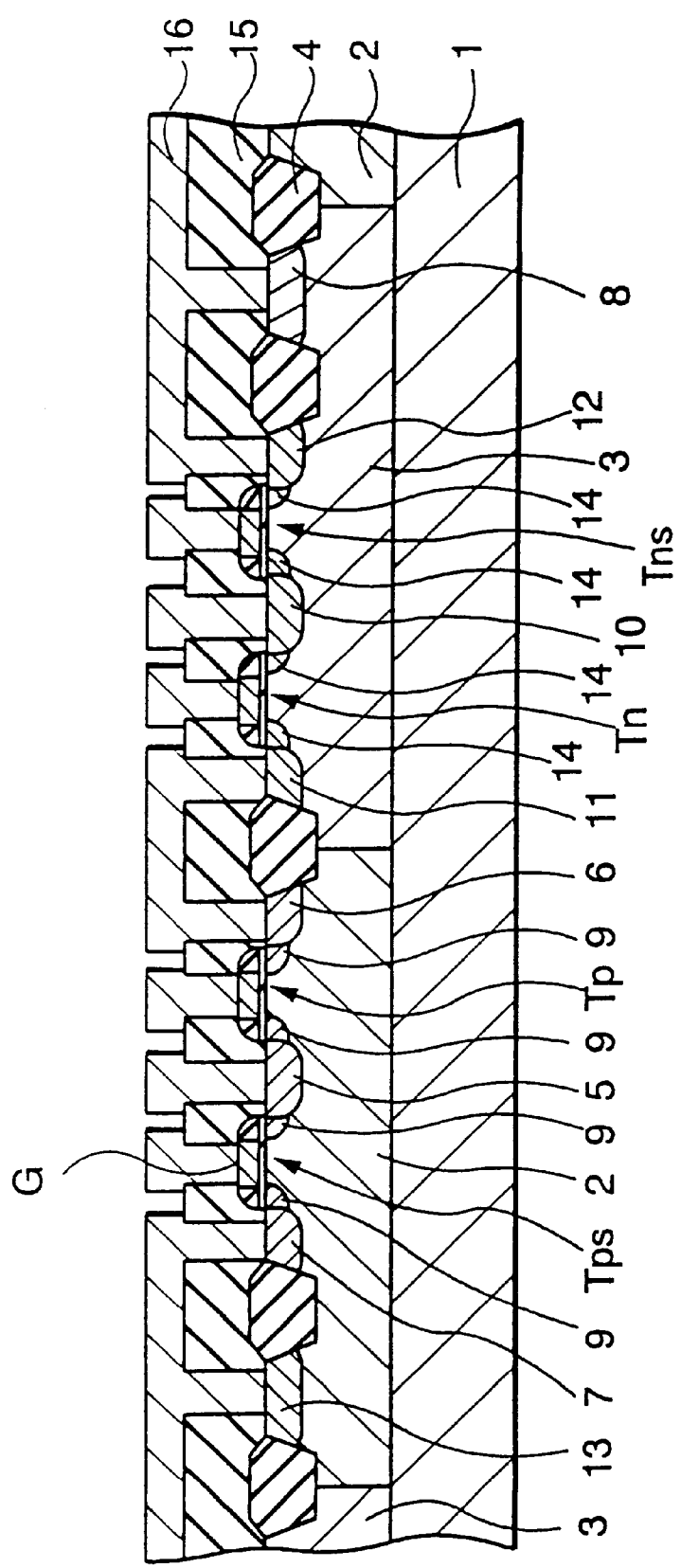
FIG. 8 is a schematic sectional view showing a fabrication step of the semiconductor integrated circuit of an embodiment of the present invention.

Then, as shown in FIG. 8, a silicon oxide film, for example, is deposited on the p-type semiconductor substrate 1 by the CVD (Chemical Vapor Deposition) method to form an insulating film 15.

Then, a through-hole is formed on a selective region of the insulating film 15 by using the potolithography art and the selective etching art.

Thereafter, an aluminum film, for example, is deposited on the p-type semiconductor substrate 1 by the sputtering method to form a wiring layer 16.

Then, a selective region of the wiring layer 16 is removed by using the photolithography art and selective etching art to form a patterned wiring layer 16.

Figure 9:
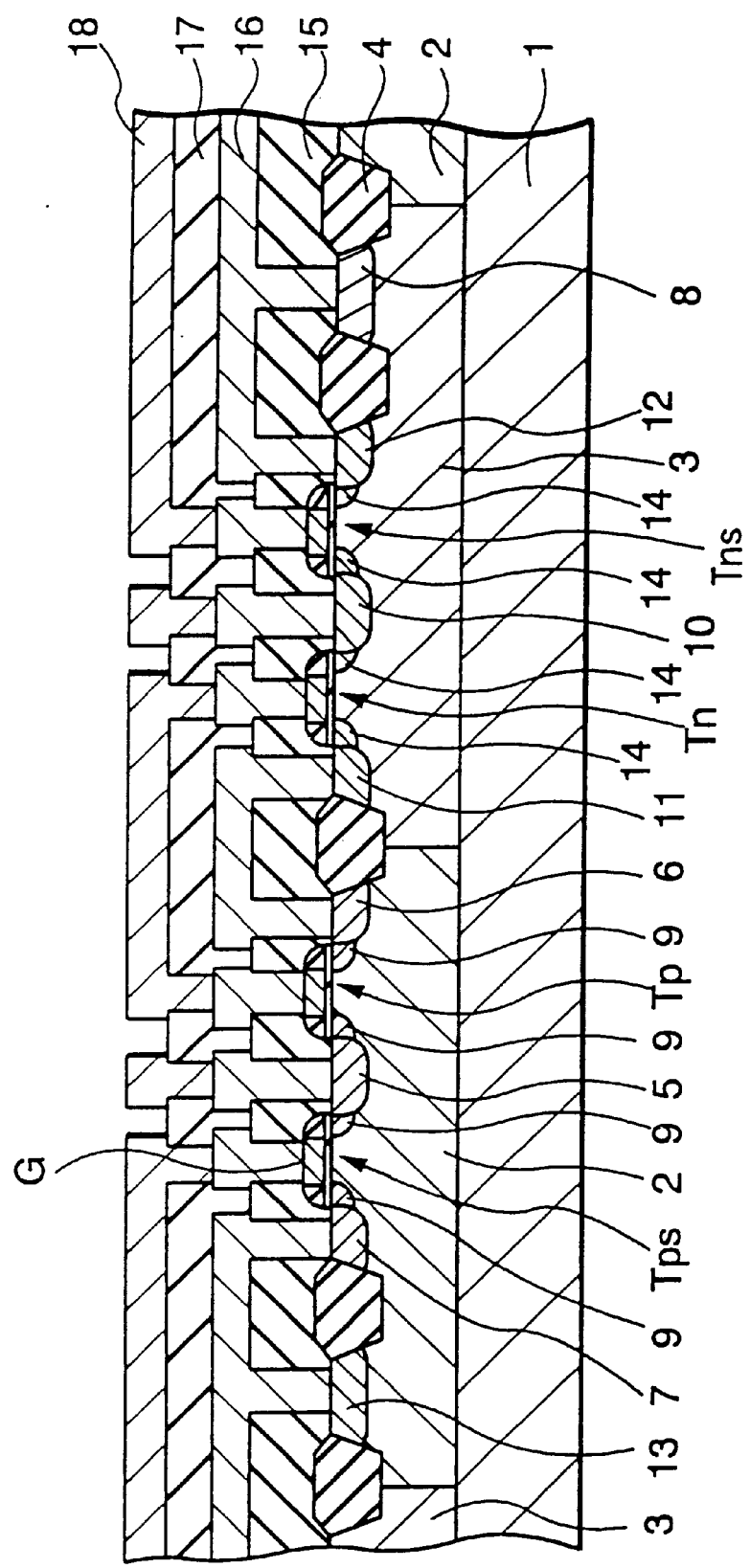
FIG. 9 is a schematic sectional view showing a fabrication step of the semiconductor integrated circuit of an embodiment of the present invention.

Then, as shown in FIG. 9, a silicon oxide film, for example, is deposited on the p-type semiconductor substrate 1 by the CVD method to form an insulating film 17.

Thereafter, a through-hole is formed on a selective region of the insulating film 17 by using the photolithography art and the selective etching art.

Then, an aluminum film, for example, is deposited on the p-type semiconductor substrate 1 by the sputtering method to form a wiring layer 18.

Then, the selective region of the wiring layer 18 is removed by using the photolithography art and the selective etching art to form a patterned wiring layer 18.

In this case, a first power-supply-voltage line Vdd, second power-supply-voltage line Vss, input line IN, and output line OUT of a CMOS FET are formed by the wiring layers 16 and 18 in the same step.

Moreover, a control signal line Cw1 for controlling the switching transistor Tps, a well feeding line Vw1 connected to the drain of the switching transistor Tps and the n-type well, control signal line Csu for controlling the switching transistor Tns, and well feeding line Vsu connected to the drain of the switching transistor Tns and the p-type well 3 are formed by the wiring layers 16 and 18 in the same step.

Thereafter, a multilayer wiring layer is formed on the p-type semiconductor substrate 1 by using the multilayer wiring art and then, a surface protection film (not illustrated) is formed to complete the CMOS semiconductor integrated circuit fabrication steps.

The above fabrication steps show a mode using the p-type semiconductor substrate 1. However, it is also possible to realize a mode for forming a semiconductor region of a conducting-type well opposite to the case of the above fabrication steps by using an n-type semiconductor substrate having a conducting type opposite to the case of the above mode.

In the case of the art for fabricating the CMOS semiconductor integrated circuit of this embodiment described above, the transistor Tp of the p-channel MOS FET for constituting a CMOS FET and the switching transistor Tps which is a feature of this embodiment are formed in the n-type well 2 in the same step.

Moreover, the transistor Tp of the p-channel MOS FET for constituting a CMOS FET and the switching transistor Tps which is a feature of this embodiment are formed in the n-type well 2 in the same step.

Furthermore, the transistor Tn of the n-channel MOS FET for constituting a CMOS FET and the switching transistor Tns which is a feature of this embodiment are formed in the p-type well 3 in the same step.

Furthermore, the first power-supply-voltage line Vdd, second power-supply-voltage line Vss, input line IN, and output line ON of a CMOS FET are formed by the wiring layers 16 and 18 in the same step.

Furthermore, the control signal line Cw1 for controlling the switching transistor Tps, well feeding line Vw1 connected to the drain of the switching transistor Tps and the n-type well 2, control signal line Csu for controlling the switching transistor Tns, and well feeding line Vsu connected to the drain of the switching transistor Tns and the p-type well 3 are formed by the wiring layers 16 and 18 in the same step.

Therefore, according to the art for fabricating the semiconductor integrated circuit of this embodiment, it is possible to form the switching transistors Tps and Tns and the control signal line Cw1, the well feeding line Vw1, the control signal line Csu, and the well feeding line Vsu connected to the transistors Tps and Tns can be formed in the step same as the step of forming a CMOS FET and the first power-supply-voltage line Vdd, the second power-supply-voltage line Vss, the input line IN, and the output line OUT connected to the CMOS FET. Thereby, it is possible to easily and simultaneously form them without adding any fabrication step.

Moreover, in the case of the art for fabricating the CMOS semiconductor integrated circuit of this embodiment described above, the source 5 of the transistor Tp and the source 5 of the switching transistor Tps are adjacently arranged in the same high-concentration p-type semiconductor region.

Furthermore, the source 10 of the transistor Tn and the source 10 of the switching transistor Tns are adjacently arranged in the same high-concentration semiconductor region.

Therefore, according to the art for fabricating the CMOS semiconductor integrated circuit of this embodiment described above, it is possible to form the switching transistors Tps and Tns in a region having the minimum area. Thus, it is possible to improve the layout efficiency.

Then, another embodiment of the present invention is described below by referring to FIGS. 10 to 17. FIGS. 10 to 17 are circuit diagrams corresponding to a schematic layout diagram showing a modification of the logic gate of the CMOS semiconductor integrated circuit of another embodiment of the present invention and each layout diagram.

Each of FIGS. 10 to 17 shows one logic gate and moreover shows that switching transistors Tps and Tns are provided for each logic gate.

Figure 10:
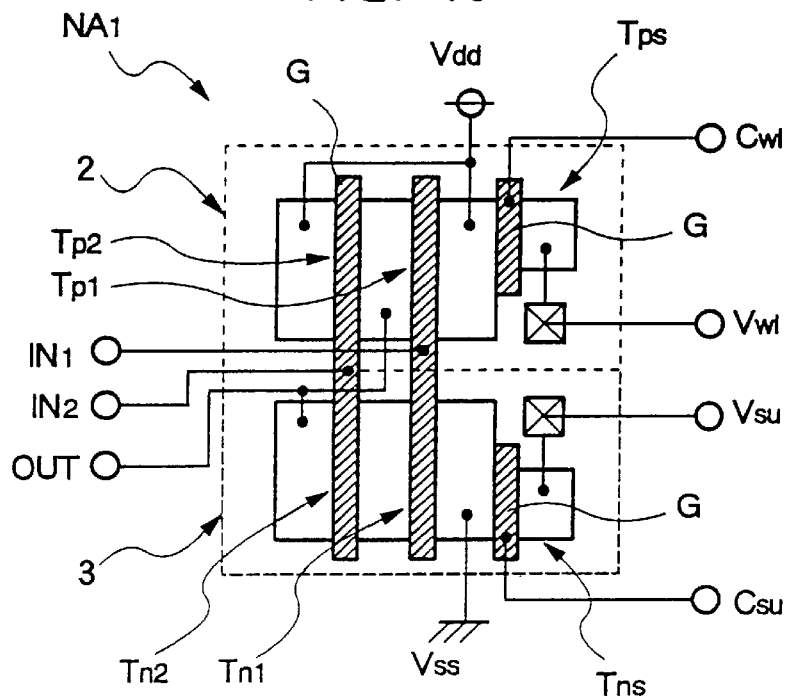
FIG. 10 is a schematic layout diagram showing the semiconductor integrated circuit of another embodiment of the present invention.
Figure 11:
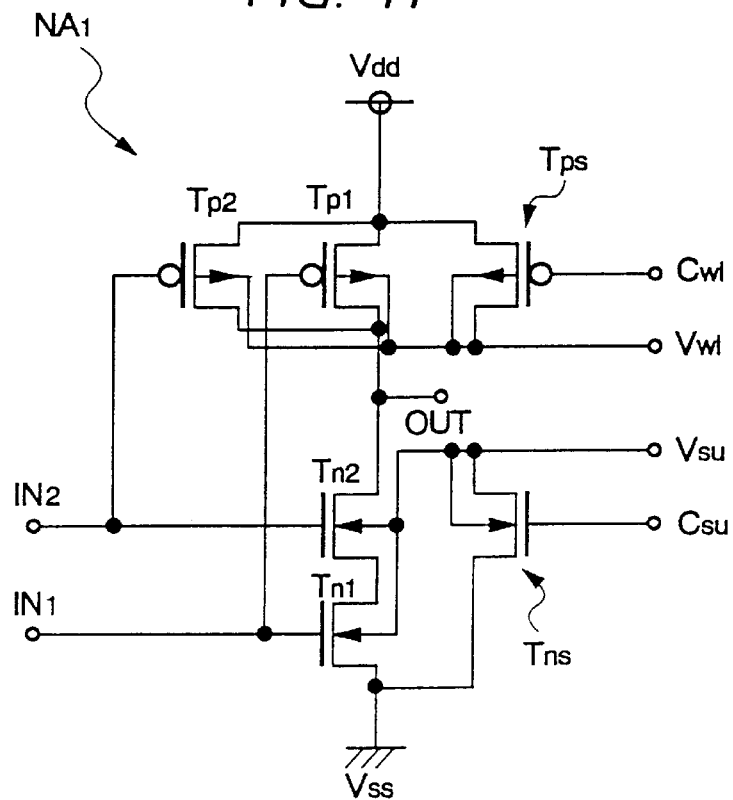
FIG. 11 is a circuit diagram of the logic gate in FIG. 10.

FIG. 10 is a schematic layout diagram showing a CMOS semiconductor integrated circuit having a 2-input NAND gate circuit NA1 and FIG. 11 is a circuit diagram of the circuit NA1.

The 2-input NAND gate circuit NA1 is constituted by electrically connecting two transistors Tp1 and Tp2 connected each other in parallel and two transistors Tn1 and Tn2 connected each other in series between power-supply-voltage lines Vdd and Vss. The transistors Tp1 and Tp2 respectively have a p-channel MOS FET and are formed in an n-type well 2. Moreover, the transistors Tn1 and Tn2 respectively have an n-channel MOS FET and are formed in a p-type well 3.

The gate electrodes of the transistors Tp1 and Tn1 are electrically connected each other and moreover, electrically connected to an input line IN1. The gate electrodes of the transistors Tp2 and Tn2 are electrically connected each other and moreover, electrically connected to an input line IN2. The drains of the transistors Tp1 and Tp2 and the drain of the transistor Tn2 are electrically connected each other and moreover, electrically connected with an output line OUT.

Figure 12:
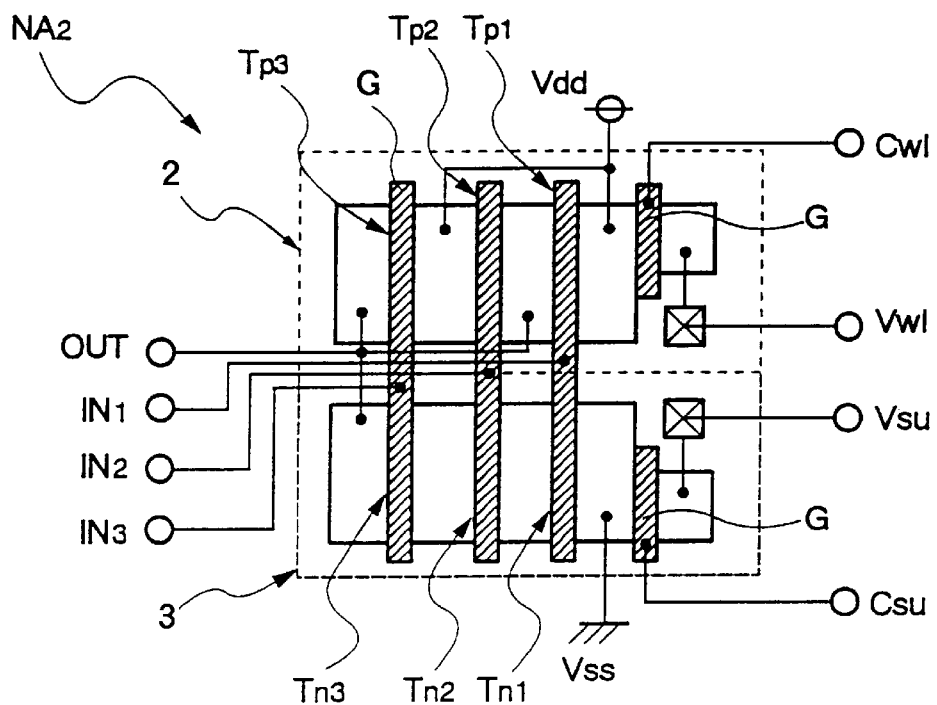
FIG. 12 is a schematic layout diagram showing the semiconductor integrated circuit of still another embodiment of the present invention.
Figure 13:
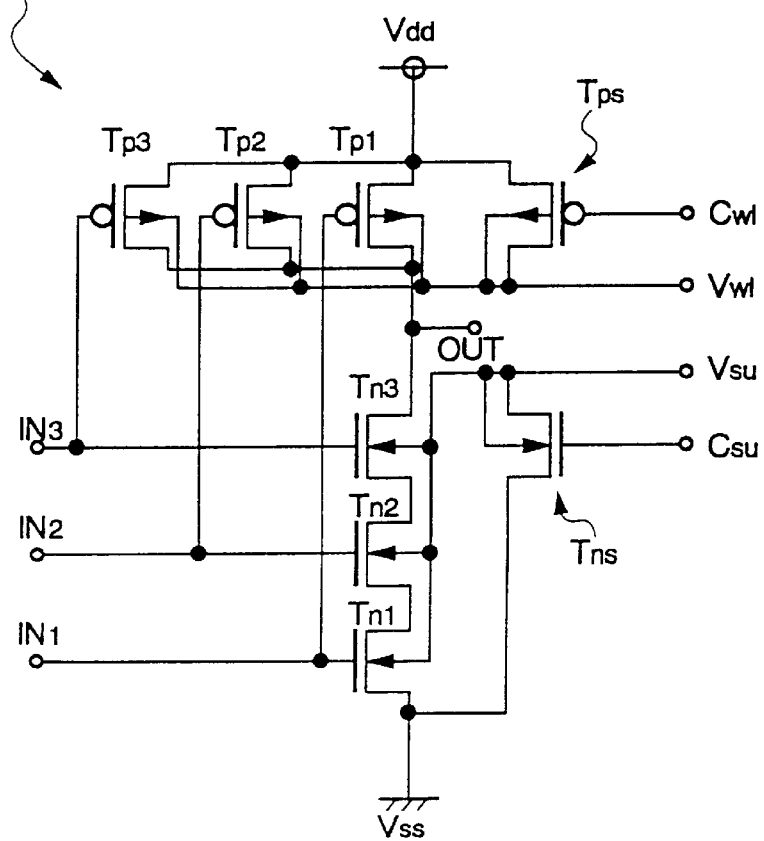
FIG. 13 is a circuit diagram of the logic gate in FIG. 12.

FIG. 12 is a schematic layout diagram showing a CMOS semiconductor integrated circuit having a 3-input NAND gate circuit NA2 and FIG. 13 is a circuit diagram of the circuit NA2.

The 3-input NAND gate circuit NA2 is constituted by electrically connecting three transistors Tp1, Tp2, and Tp3 connected each other in parallel and three transistors Tn1, Tn2, and Tn3 connected each other in series between power-supply-voltage lines Vdd and Vss. The transistors Tp1, Tp2, and Tp3 respectively have a p-channel MOS FET and are formed in an n-type well 2. Moreover, the transistors Tn1, Tn2, and Tn3 respectively have an n-channel MOS FET and are formed in a p-type well 3.

The gate electrodes of the transistors Tp1 and Tn1 are electrically connected each other and moreover, electrically connected with an input line IN1. The gate electrodes of the transistors Tp2 and Tn2 are electrically connected each other and moreover, electrically connected with an input line IN2. The gate electrodes of the transistors Tp3 and Tn3 are electrically connected each other and moreover, electrically connected to an input line IN3. The drains of the transistors Tp1 to Tp3 and the drain of the transistor Tn3 are electrically connected each other and moreover, electrically connected with an output line OUT.

Figure 14:
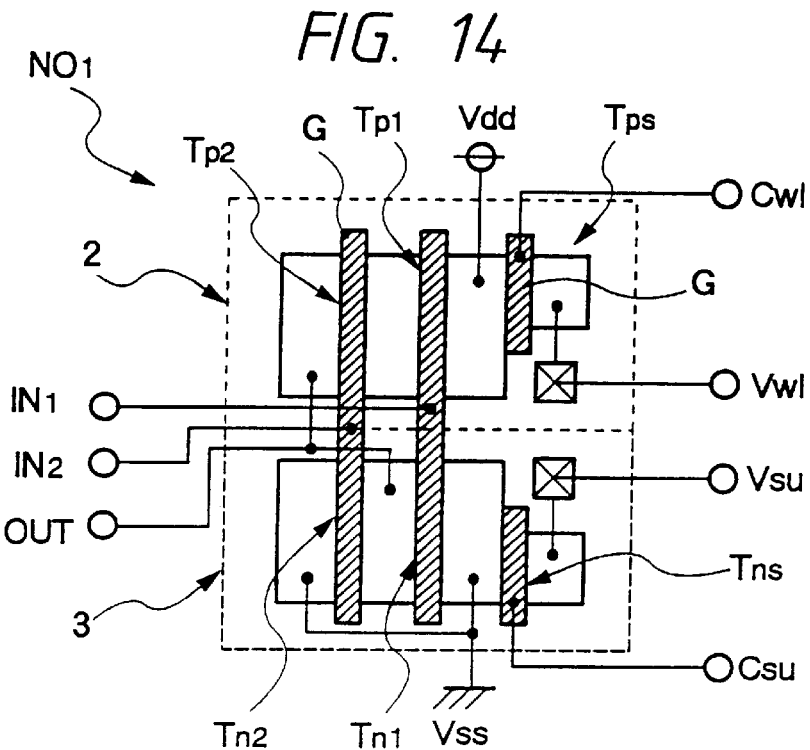
FIG. 14 is a schematic layout diagram showing the semiconductor integrated circuit of still another embodiment of the present invention.
Figure 15:
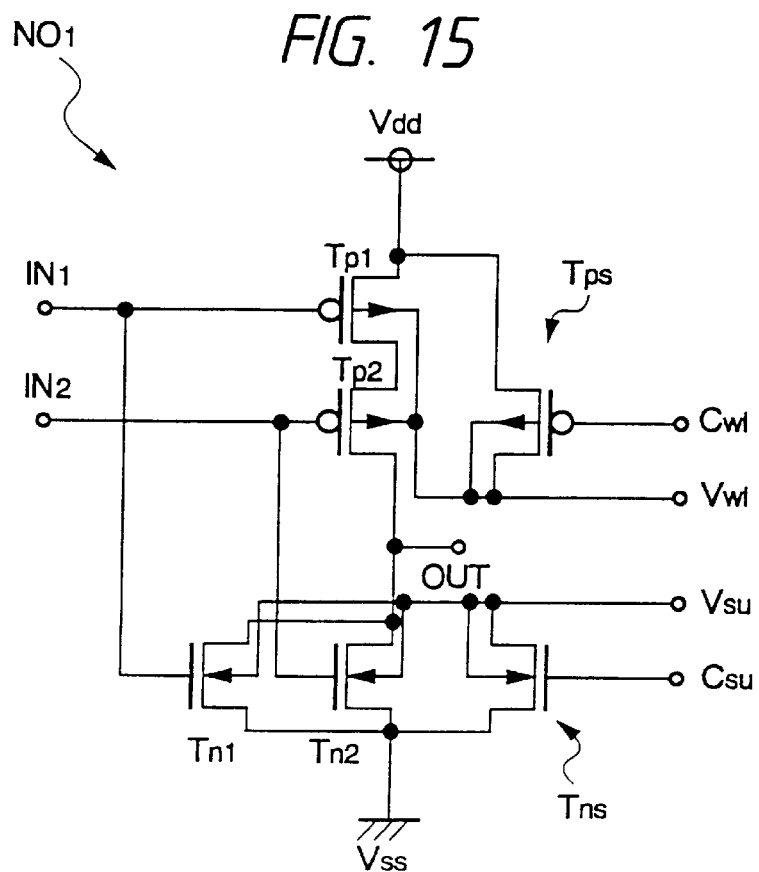
FIG. 15 is a circuit diagram of the logic gate in FIG. 14.

FIG. 14 is a schematic layout diagram showing a CMOS semiconductor integrated circuit having a 2-input NOR gate circuit NO1 and FIG. 15 is a circuit diagram of the circuit NO1.

The 2-input NOR gate circuit has two transistors Tp1 and Tp2 and two transistors Tn1 and Tn2 in an n-type well 2 and a p-type well 3 respectively.

The 2-input NOR gate circuit NO1 is constituted by electrically connecting two transistors Tp1 and Tp2 connected each other in series and two transistors Tn1 and Tn2 connected each other in parallel between power-supply-voltage lines Vdd and Vss. The transistors Tp1 and Tp2 respectively have a p-channel MOS FET and are formed in an n-type well 2. Moreover, the transistors Tn1 and Tn2 respectively have an n-channel MOS FET and are formed in a p-type well 3.

The gate electrodes of the transistors Tp1 and Tn1 are electrically connected each other and moreover, electrically connected with an input line IN1. The gate electrodes of the transistors Tp2 and Tn2 are electrically connected each other and moreover, electrically connected with an input line IN2. The drain of the transistor Tp2 and the drains of the transistors Tn1 and Tn2 are electrically connected each other and moreover, electrically connected with an output line OUT.

Figure 16:
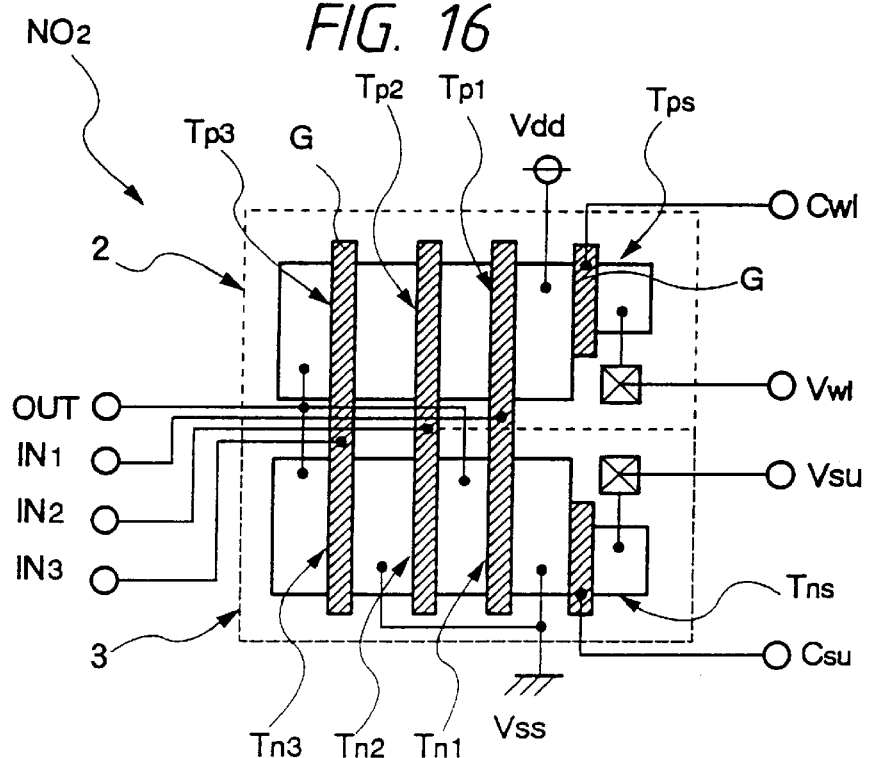
FIG. 16 is a schematic layout diagram showing the semiconductor integrated circuit of still another embodiment of the present invention.
Figure 17:
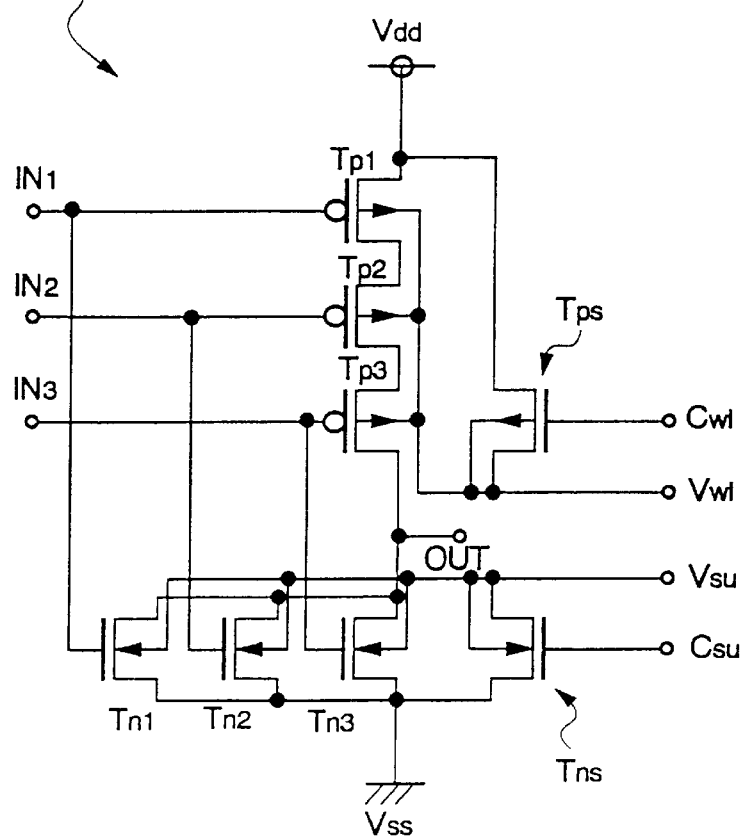
FIG. 17 is a circuit diagram of the logic gate in FIG. 16.

FIG. 16 is a schematic layout diagram of a CMOS semiconductor integrated circuit having a 3-input NOR gate circuit NO2 and FIG. 17 is a circuit diagram of the circuit NO2.

The 3-input NOR gate circuit NO2 is constituted by electrically connecting three transistors Tp1, Tp2, and Tp3 connected each other in series and three transistors Tn1, Tn2, and Tn3 connected each other in parallel between power-supply-voltage lines vdd and Vss.

The transistors Tp1, Tp2, and Tp3 respectively have a p-channel CMOS FET and are formed in an n-type well 2. Moreover, the transistors Tn1, Tn2, and Tn3 respectively have an n-channel MOS FET and are formed in a p-type well 3.

The gate electrodes of the transistors Tp1 and Tn1 are electrically connected each other and moreover, electrically connected with an input line IN1. The gate electrodes of the transistors Tp2 and Tn2 are electrically connected each other and moreover, electrically connected with an input line IN2. The gate electrodes of the transistors Tp3 and Tn3 are electrically connected each other and moreover, electrically connected with an input line IN3. The drain of the transistor Tp3 and the drains of the transistors Tn1, Tn2, and Tn3 are electrically connected each other and moreover, electrically connected with an output line OUT.

As shown in FIGS. 10 to 17, by arranging switching transistors Tps and Tns respectively having a MOS FET in the n-type well 2 and the p-type well 3 similarly to the case of the CMOS semiconductor integrated circuit of the above embodiment 1 and using control signal lines Cw1 and Csu for controlling the switching transistors Tps and Tns, a well feeding line Vw1 connected to the n-type well 2, and a well feeding line Vsu connected to the p-type well 3, it is possible to prevent the latch-up phenomenon and fluctuation of operation speeds particularly under the normal operation of a semiconductor integrated circuit and realize a high-performance and high-reliability semiconductor integrated circuit.

Moreover, when performing a test of a semiconductor integrated circuit, it is possible to control a leak current and moreover, control thermal runaway due to the leak current. Therefore, it is possible to improve the yield and reliability of semiconductor integrated circuits.

Figure 18:
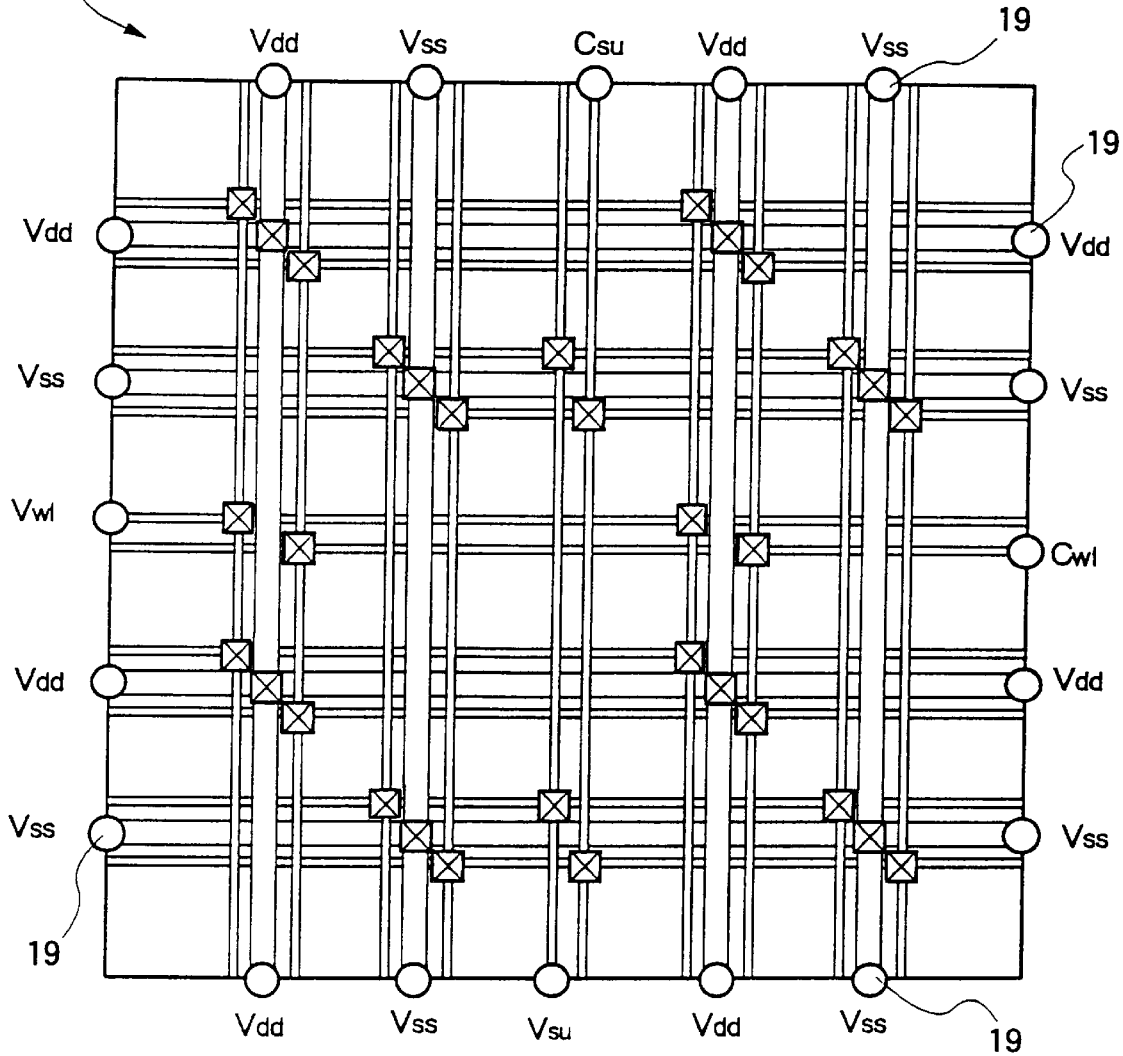
FIG. 18 is an illustration schematically showing the semiconductor chip of the semiconductor integrated circuit of still another embodiment of the present invention.

Then, still another embodiment of the present invention is described below by referring to FIG. 18. FIG. 18 schematically shows the arrangement of power-supply-voltage lines and control signal lines in a semiconductor chip SC of the CMOS semiconductor integrated circuit of this embodiment.

As shown in FIG. 18, a mode in which wirings are arranged like a lattice can be applied to the wiring layout of the CMOS semiconductor integrated circuit of this embodiment.

A pin 19 is formed at ends of each wiring and power supply voltages Vdd and Vss necessary for circuit operations are inputted through a plurality of pins 19.

A well feeding lines Vw1 and Vsu are connected to the input of the internal circuit of the semiconductor chip SC through a certain pin 19 in the semiconductor chip SC.

Moreover, a control signal lines Cw1 and Csu are connected to the input of the internal circuit of the semiconductor SC through a certain pin 19.

According to the CMOS semiconductor integrated circuit of this embodiment, the control signal lines Cw1 and Csu and the well feeding lines Vw1 and Vsu are electrically connected with the power-supply-voltage lines Vdd and Vss through a high resistor respectively and the control signal lines Cw1 and Csu and the well feeding lines Vw1 and Vsu are fixed to a predetermined potential under the normal operation of the semiconductor integrated circuit. Thereby, under the normal operation of the semiconductor integrated circuit, it is possible to make the semiconductor integrated circuit perform a desired operation without supplying a predetermined signal or voltage to the control signal lines Cw1 and Csu and well feeding lines Vw1 and Vsu from an external unit. Of course, it is also possible to supply a predetermined signal or voltage from an external unit.

Moreover, under a test of the semiconductor integrated circuit, a predetermined signal or voltage is forcibly supplied to the control signal lines Cw1 and Csu and well feeding lines Vw1 and Vsu from an external unit through the pins 19 by using a power supply unit having a resistance smaller than that of the above resistor.

Figure 19:
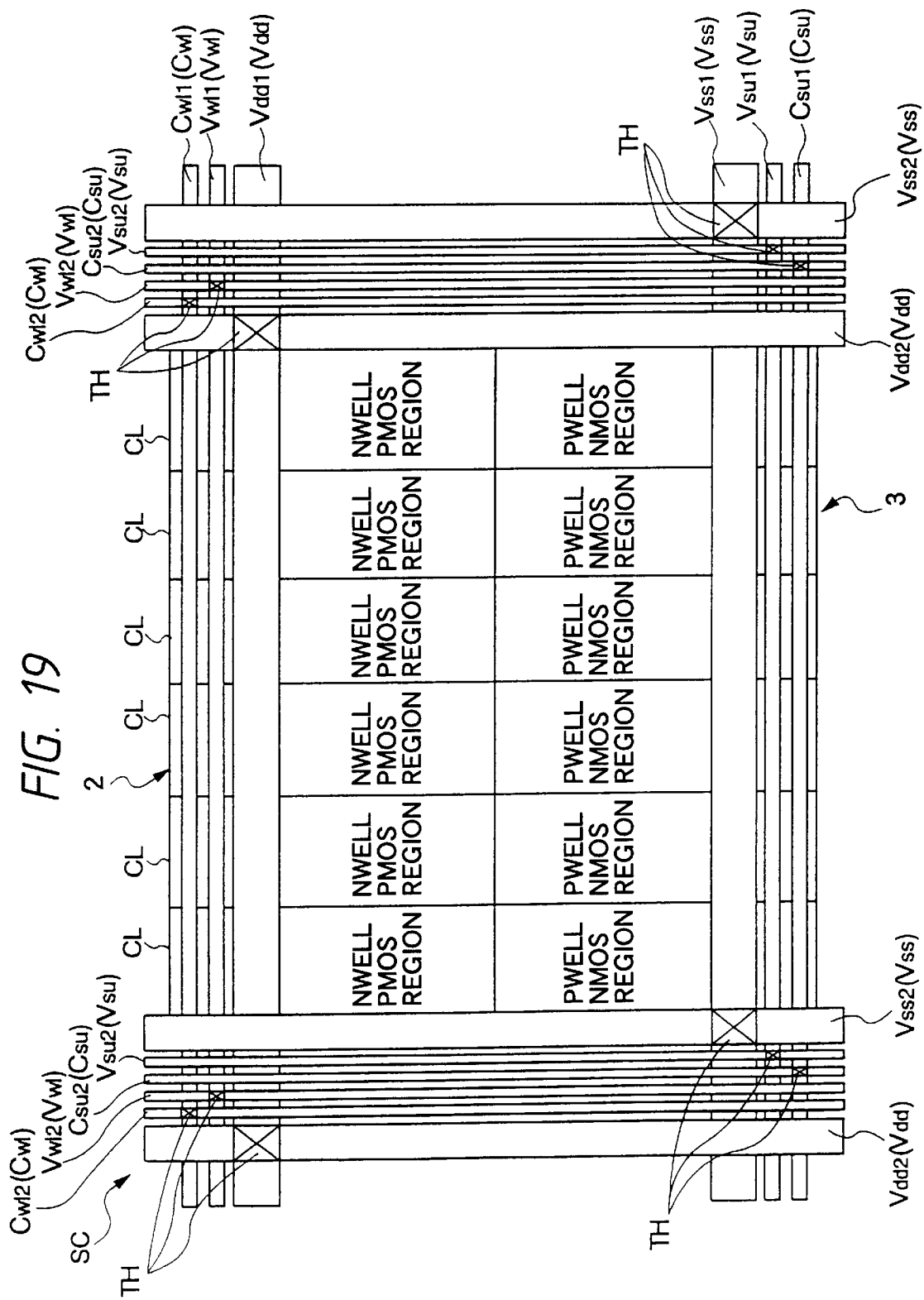
FIG. 19 is a top view of an essential portion of the semiconductor chip of the semiconductor integrated circuit of still another embodiment of the present invention.

Then, still another embodiment of the present invention is described below by referring to FIG. 19. FIG. 19 shows a top view of an essential portion of a semiconductor chip SC.

An n-type well 2 and a p-type well 3 are formed on the semiconductor chip SC under a state extended along the transverse direction of FIG. 19, that is, along the arrangement direction of cell regions CL.

In FIG. 19, the n-type well 2 and the p-type well 3 are shown as if each of them is divided into a plurality of wells. However, this shows the partition of one cell region CL and each of the n-type well 2 and the p-type well 3 is not divided into a plurality of wells. That is, the wells 2 and 3 are integrally formed, that is, they are electrically connected as a semiconductor region in which predetermined impurity distributions are continued.

The cell region CL is a region in which a group of devices required to form a logic gate of the basic unit are arranged and its range is set so as to include the n-type well 2 and the p-type well 3.

Moreover, power-supply-voltage lines Vdd and Vss, well feeding lines Vw1 and Vsu, and the control signal lines Cw1 and Csu are arranged on the principal plane of the semiconductor chip SC so as to enclose a group of the cell regions CL described above. Furthermore, the power-supply-voltage lines Vdd and Vss, the well feeding lines Vw1 and Vsu, and the control signal lines Cw1 and Csu are arranged on the principal plane of the semiconductor chip SC like a lattice. FIG. 19 shows the basic unit of the lattice.

A power-supply-voltage line Vdd1, the well feeding line Vw11, and the control signal line Cw11 are arranged nearby longitudinal ends (upper side of FIG. 19) of the cell regions CL so as to cross each cell region CL while the lines are extended along the arrangement direction of the cell regions CL. The power-supply-voltage line Vdd1, the well feeding line Vw11, and the control signal line Cw11 are arranged in order along the direction toward the outer boundary of each cell region CL from the center of the region CL.

A power-supply-voltage line Vss1, the well feeding line Vsu1, and the control signal line Csu1 are arranged nearby longitudinal ends (lower side of FIG. 19) of the cell regions CL so as to cross each cell region CL while the lines are extended along the arrangement direction of the cell regions CL. The power-supply-voltage line Vss1, the well feeding line Vsu1, and the control signal line Csu1 are arranged in order along the direction toward the outer boundary of each cell region CL from the center of the region CL.

These power-supply-voltage lines Vdd1 and Vss1, the well feeding lines Vw11 and Vsu1, and the control signal lines Cw11 and Csu1 are made of, for example, aluminum or aluminum alloy and formed on the first wiring layer.

Moreover, power-supply-voltage lines Vdd2, Vss2 the well feeding lines Vw12 and Vsu2, and the control signal lines Cw12 and Cw12 are arranged so as to be perpendicular to the arrangement direction of the cell regions CL while they are extended. Furthermore, power-supply-voltage lines Vdd2 and Vss2, the well feeding lines Vw12 and Vsu2, and the control signal lines Cw12 and Cw12 are arranged so as to be put between the power-supply-voltage lines Vdd2 and Vss2.

These power-supply-voltage lines Vdd2 and Vss2, the well feeding lines Vw12 and Vsu2, and the control signal lines Cw12 and Csu2 are made of, for example, aluminum or aluminum alloy and formed on the second wiring layer.

These power-supply-voltage lines vdd2 and Vss2, the well feeding lines Vw12 and Vsu2, and the control signal lines Cw12 and Csu2 arranged on the second wiring layer are electrically connected each other at the intersection between the power-supply-voltage lines Vdd1 and Vss1, the well feeding lines Vw11 and Vsu1, and the control signal lines Cw11 and Csu1 arranged on the first wiring layer.

This embodiment has the following structure. First, one switching transistor Tps and one switching transistor Tns (see FIG. 3, etc.) are arranged for each cell region CL, that is, for each logic gate similarly to the case of the preceding embodiment. Therefore, it is possible to obtain the same advantage as the preceding embodiment.

Figure 20:
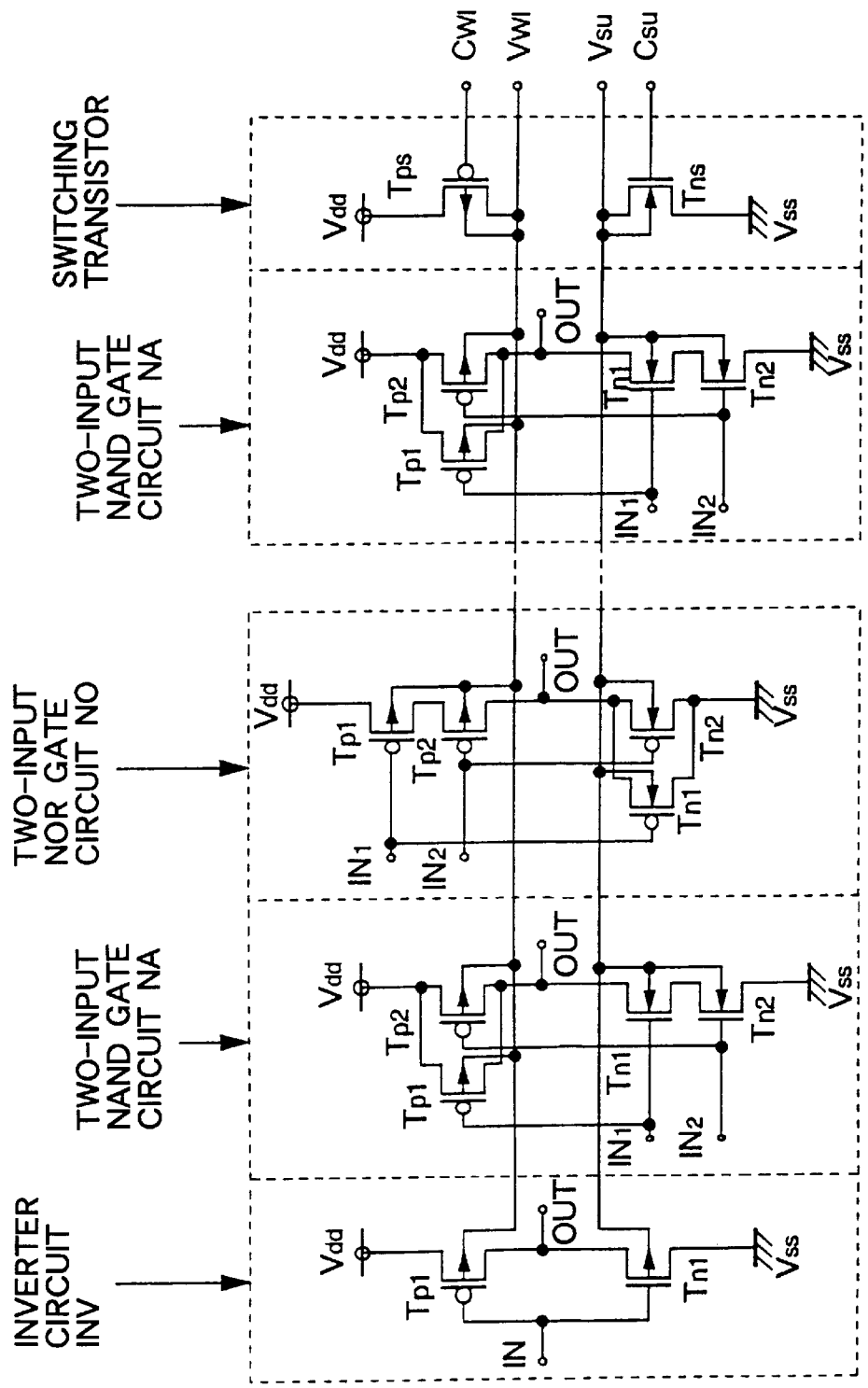
FIG. 20 is a circuit diagram of an essential portion of the semiconductor integrated circuit of still another embodiment of the present invention.

Then, still another embodiment of the present invention is described below by referring to FIGS. 20 to 25. FIG. 20 shows a circuit diagram of an essential portion of the CMOS semiconductor integrated circuit of this embodiment.

In the case of this embodiment, one switching transistor Tps and one switching transistor Tns described above are provided for a plurality of logic gates. FIG. 20 shows an inverter circuit INV, 2-input NAND gate circuit NA, and 2-input NOR gate circuit NO as logic gates.

However, types of logic gates are not restricted to the above ones but they can be variously modified. Moreover, a group of logic gates in which one switching transistor is set is not restricted to a group of different types of logic gates but a group of same types of logic gates can be also used.

The inverter circuit INV is constituted by connecting the transistors Tp1 and Tn1 between the power-supply-voltage lines Vdd and Vss in series. The gate electrodes of the transistors Tp1 and Tn1 are electrically connected each other and moreover, electrically connected with an input line IN.

The 2-input NAND gate circuit NA is constituted by electrically connecting two transistors Tp1 and Tp2 connected each other in parallel and two transistors Tn1 and Tn2 connected each other in series between the power-supply-voltage lines Vdd and Vss. The gate electrodes of the transistors Tp1 and Tn1 are electrically connected each other and moreover, electrically connected with an input line IN1. The gate electrodes of the transistors Tp2 and Tn2 are electrically connected each other and moreover, electrically connected with an input line IN2. The drains of the transistors Tp1 and Tp2 are electrically connected with the drain of the transistor Tn1.

The 2-input NOR gate circuit NO is constituted by electrically connecting two transistors Tp1 and Tp2 connected each other in series and two transistors Tn1 and Tn2 connected each other in parallel between the power-supply-voltage lines Vdd and Vss. The gate electrodes of the transistors Tp1 and Tn1 are electrically connected each other and moreover, electrically connected with the input line IN1. The gate electrodes of the transistors Tp2 and Tn2 are electrically connected each other and moreover, electrically connected with the input line IN2. The drain of the transistor Tp2 is electrically connected with the drains of the transistors Tn1 and Tn2.

The substrate potentials of the transistors Tp1, Tp2, Tn1, and Tn2 and the switching transistors Tps and Tns of the inverter circuits INV, 2-input NAND circuit NA, and 2-input NOR circuit NO are supplied from the well feeding lines Vw1 and Vsu.

The switching transistor Tps is electrically connected between the well feeding lines Vw1 and the power-supply-voltage line Vdd. Moreover, the switching transistor Tns is electrically connected between the well feeding line Vsu and the power-supply-voltage line Vss.

That is, when testing a semiconductor integrated circuit, it is possible to control a lead current and the thermal runaway due to the leak current by turning off the switching transistors Tps and Tns and supplying a predetermined potential to the well feeding lines Vw1 and Vsu. Thereby, it is possible to improve the yield and reliability of semiconductor integrated circuits.

Moreover, in the case of the normal operation of a semiconductor integrated circuit, it is possible to prevent the fluctuation of the latch-up phenomenon and operation speed by turning on the switching transistors Tps and Tns and supplying the power supply voltages Vdd and Vss. Therefore, it is possible to secure the operation reliability of a semiconductor integrated circuit.

Figure 21:
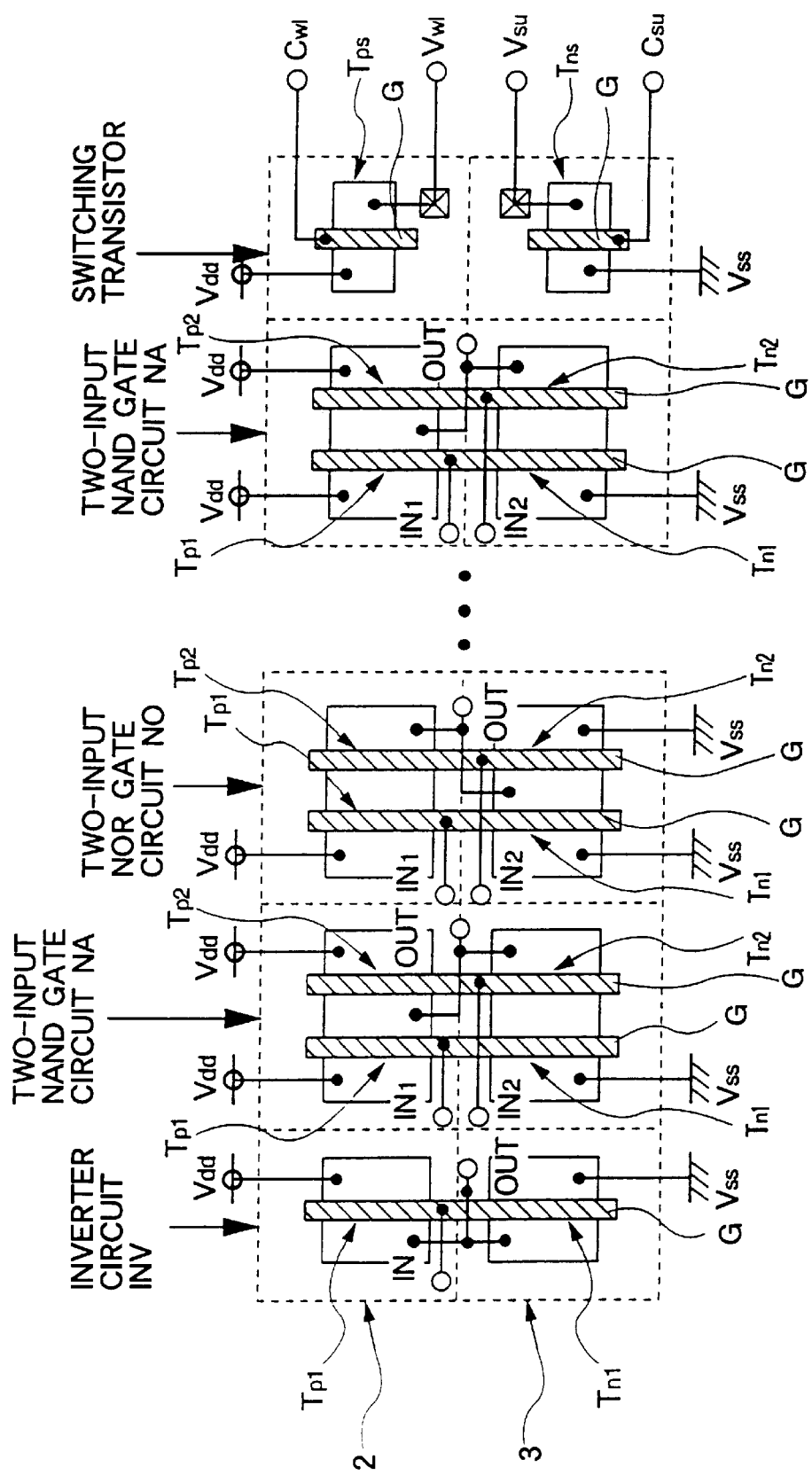
FIG. 21 is a layout diagram showing an example of the layout of the semiconductor integrated circuit in FIG. 20.
Figure 22:
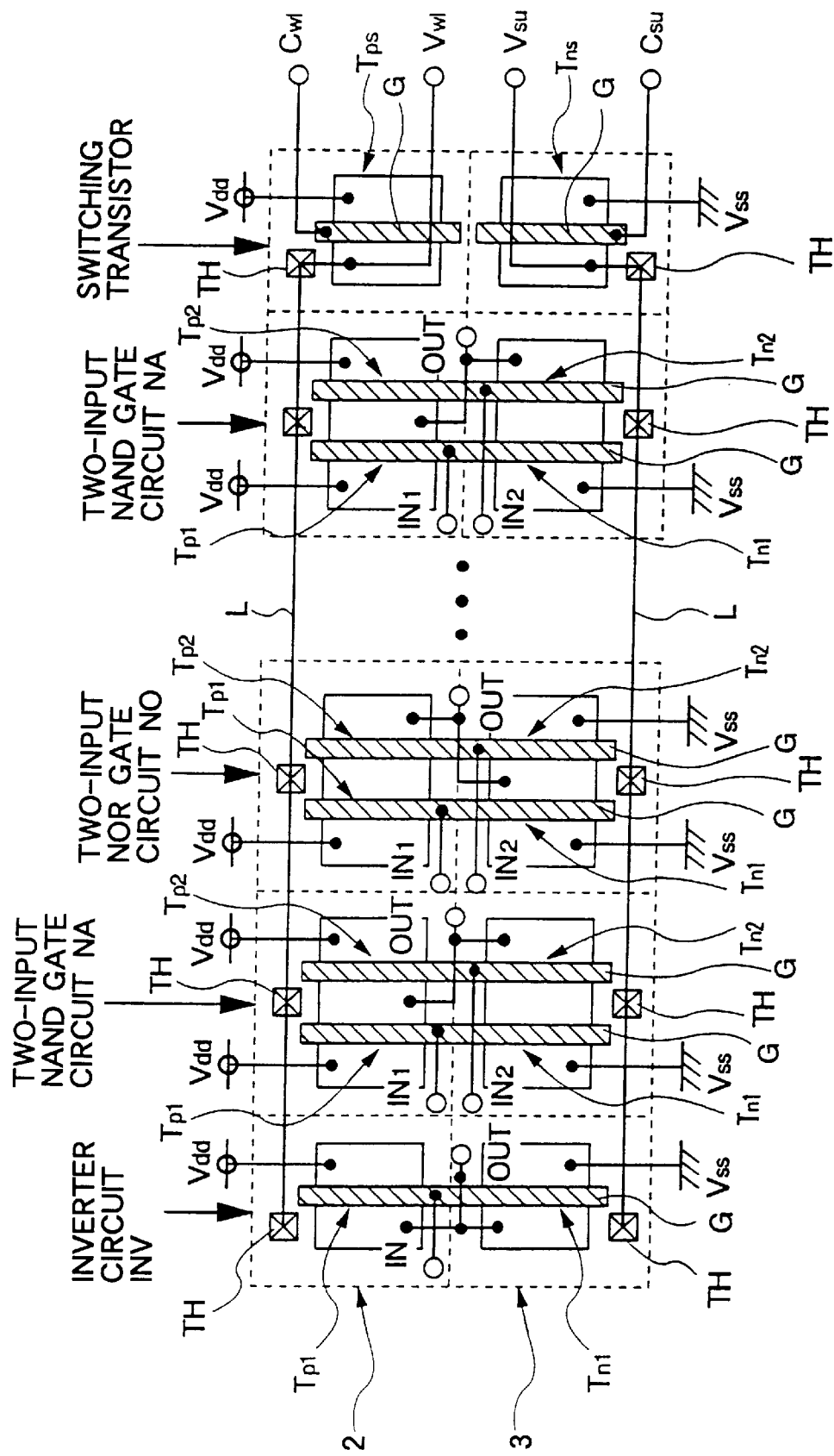
FIG. 22 is a layout diagram showing an example of the layout of the semiconductor integrated circuit in FIG. 20.

FIGS. 21 and 22 show examples of the layout of the circuit shown in FIG. 20.

FIG. 21 shows a case of constituting the well feeding lines Vw1 and Vsu with an n-type well 2 and a p-type well 3. That is, FIG. 21 shows a structure of supplying the well feeding voltages Vw1 and Vsu to the wells of a plurality of logic gates through the n-type well 2 and the p-type well 3 respectively.

FIG. 22 shows a case in which the well feeding lines Vw1 and Vsu are formed with the wiring L. That is, FIG. 22 shows a structure of supplying the well feeding voltages Vw1 and Vsu to wells of a plurality of logic gates through the wiring L.

The wiring L is electrically connected to the n-type well 2 and the p-type well 3 in the cell region CL of each logic gate through a connection hole TH. That is, it is possible to supply the well feeding voltages Vw1 and Vsu from the vicinity of each logic gate. Therefore, in the case of the structure in FIG. 22, it is possible to supply the well feeding voltages Vw1 and Vsu to each logic gate more stably than the case of the structure in FIG. 21.

Figure 23:
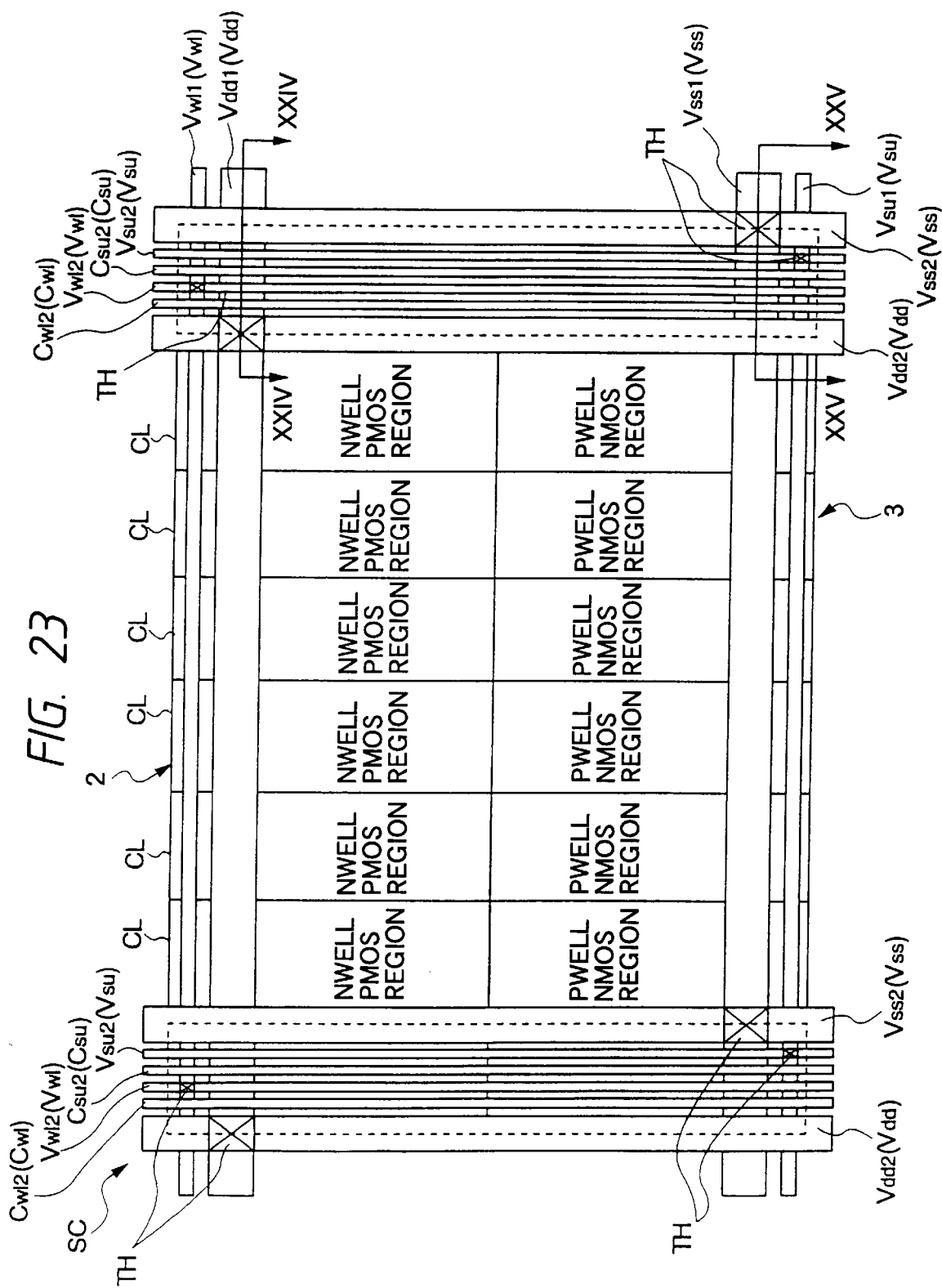
FIG. 23 is a top view of an essential portion of the semiconductor chip of the semiconductor integrated circuit in FIG. 20.
Figure 24:
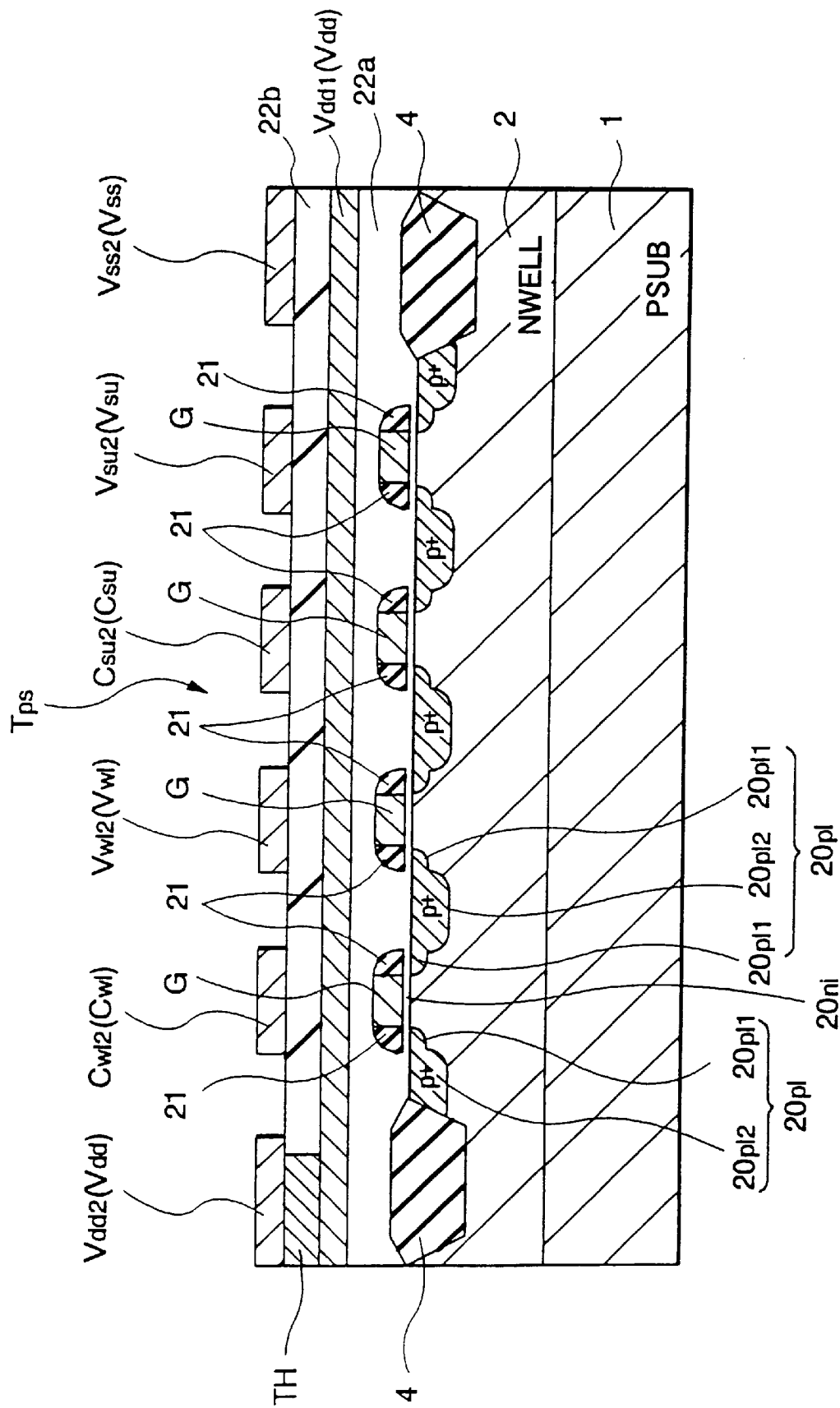
FIG. 24 is a sectional view taken along the line XXIV—XXIV in FIG. 23.
Figure 25:
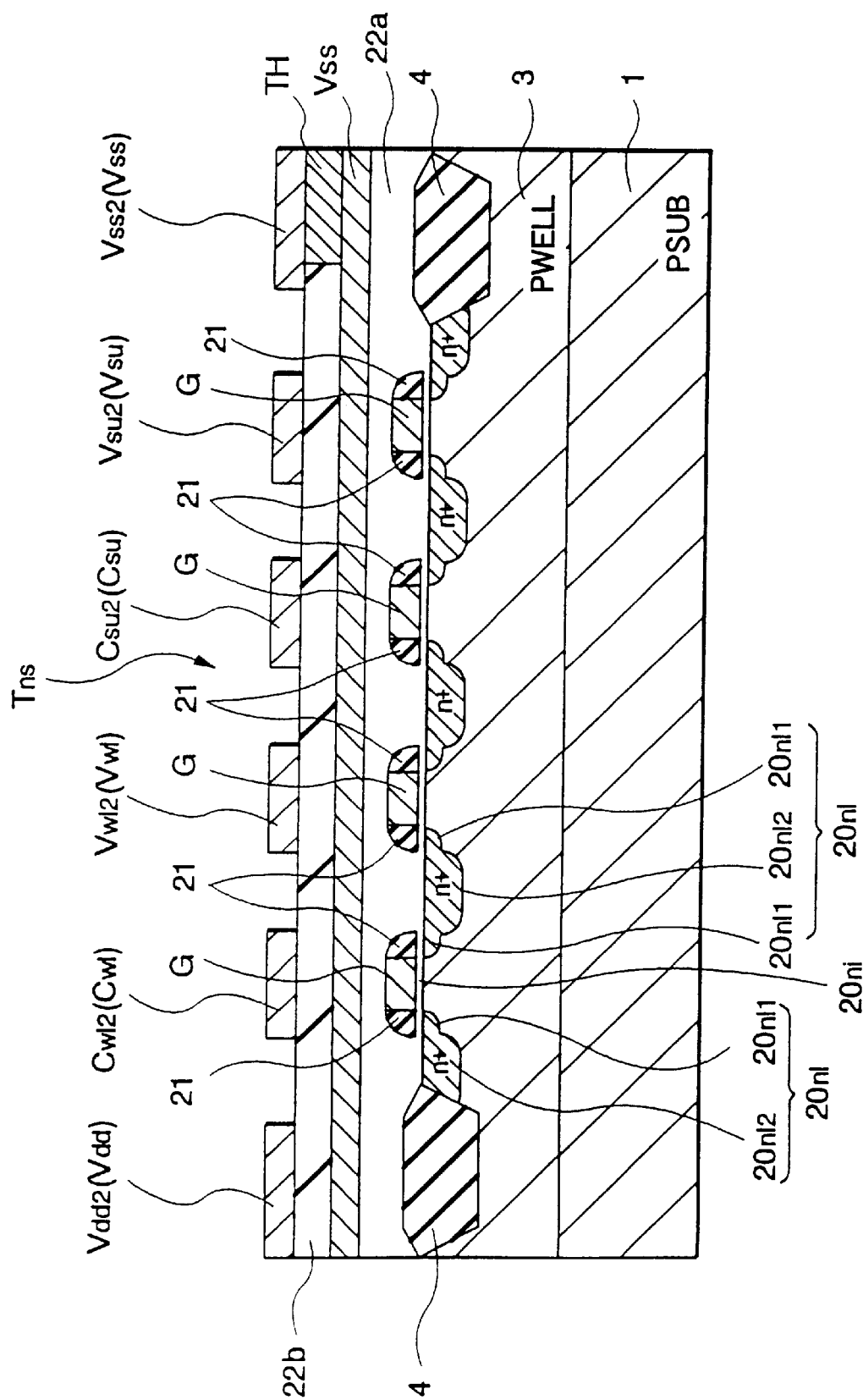
FIG. 25 is a sectional view taken along the line XXV—XXV in FIG. 23.

FIG. 23 shows a top view of an essential portion of a semiconductor chip using the structure in FIG. 22. FIG. 24 shows a sectional view taken along the line XXIV—XXIV in FIG. 23 and FIG. 25 show a sectional view taken along the line XXV—XXV in FIG. 23.

The n-type well 2 and the p-type well 3 are formed on the semiconductor chip SC along the transverse direction of FIG. 23, that is, while they are extended along the arrangement direction of the cell regions CL.

In FIG. 23, the n-type well 2 and the p-type well 3 are shown as if they are respectively divided into a plurality of wells. However, this shows the partition of one cell region CL. That is, each of the n-type well 2 and the p-type well 3 is not divided into a plurality of wells but the wells are electrically connected each other as one semiconductor region in which predetermined impurity distributions are continued.

The cell region CL is a region in which a group of devices required to form a logic gate of the basic unit and its range is set so as to include the n-type well 2 and the p-type well 3.

Moreover, the power-supply-voltage lines vdd and Vss and the well feeding lines Vw1 and Vsu are arranged on the principal plane of the semiconductor chip SC so as to enclose a group of the above cell regions CL. In the case of the control signal lines Cw1 and Csu, however, only those extending in the longitudinal direction of FIG. 23, that is, the direction perpendicular to the arrangement direction of the cell regions CL are arranged.

This is because, in the case of this embodiment, as described later, the switching transistors Tps and Tns (see FIG. 20, etc.) are formed immediately below power-supply-voltage lines Vdd2 and Vss2, well feeding lines Vw12 and Vsu2, and control signal lines Cw12 and Csu2 which extend in the direction perpendicular to the arrangement direction of the cell regions CL and thereby, it is unnecessary to arrange the control signal lines Cw12 and Csu2 by extending them in the transverse direction of FIG. 23, that is, in the arrangement direction of the cell regions CL. Therefore, in the case of this embodiment, it is possible to decrease the dimension in the longitudinal direction of FIG. 23, that is, the dimension in the longitudinal direction of the cell region CL.

Moreover, the power-supply-voltage lines Vdd and Vss and the well feeding lines Vw1 and Vsu are arranged on the principal plane of the semiconductor chip SC like a lattice. FIG. 23 shows the basic unit of the lattice.

A power-supply-voltage lines Vdd1 and a well feeding line Vw11 are arranged while they are extended so as to cross each cell region CL along the arrangement direction of the cell regions CL at the nearby side of the ends (upper side of FIG. 23) of the cell regions CL in their longitudinal direction. Moreover, the power-supply-voltage line Vdd1 and the well feeding line Vw11 are arranged in order along the direction toward the outer boundary of the cell region CL from the center of it.

The power-supply-voltage line Vss1 and the well feeding line Vsu1 are arranged while they are extended so as to cross each cell region CL along the arrangement direction of the cell regions CL at the nearby side of the ends (lower side of FIG. 23) of the cell regions CL in their longitudinal direction. Moreover, the power-supply-voltage line Vss1 and the well feeding line Vsu1 are arranged in order in the direction toward the outer boundary of the cell region CL from the center of it.

The power-supply-voltage lines Vdd1 and Vss1 and the well feeding lines Vw11 and Vsu1 are made of, for example, aluminum or aluminum alloy and formed on the first wiring layer.

The power-supply-voltage lines Vdd2 and Vss2, the well feeding lines Vw12 and Vsu2, and the control signal lines Cw12 and Csu12 are arranged while they are extended so as to be perpendicular to the arrangement direction of the cell regions CL. Moreover, the power-supply-voltage lines Vdd2 and Vss2, the well feeding lines Vw12 and Vsu2, and the control signal lines Cw12 and Csu12 are arranged so that the well feeding lines Vw12 and Vsu2 and the control signal lines Cw12 and Csu12 are put between the power-supply-voltage lines Vdd2 and Vss2.

The power-supply-voltage lines Vdd2 and Vss2, the well feeding lines Vw12 and Vsu2, and the control signal lines Cw12 and Csu2 are made of, for example, aluminum or aluminum alloy and formed on the second wiring layer.

The power-supply-voltage lines Vdd2 and Vss2, well feeding lines Vw12 and Vsu2, and control signal lines Cw12 and Csu2 arranged on the second wiring layer are electrically connected through connection holes TH of intersections with the power-supply-voltage lines Vdd1 and Vss1, well feeding lines Vw11 and Vsu1, and control signal lines Cw1 and Csu1.

Thus, in the case of this embodiment, a set of the above switching transistors Tps and Tns are arranged every a plurality of cell regions CL, that is, every a plurality of logic gates and moreover, arranged immediately below the power-supply-voltage lines Vdd2 and Vss2, the well feeding lines Vw2 and Vsu2, and the control signal lines Cw2 and Csu2.

That is, a space area in which devices for constituting a semiconductor integrated circuit are not arranged is generally present immediately below the power-supply-voltage lines Vdd2 and Vss2, the well feeding lines Vw12 and Vsu2, and the control signal lines Cw12 and Csu2. Thus, it is possible to effectively use the principal plane of the semiconductor chip SC by providing the switching transistors Tps and Tns for the space area.

As a result, it is possible to prevent the area from increasing compared to the case of providing the switching transistors Tps and Tns for an area other than the space area. Moreover, it is possible to decrease the dimension in the longitudinal direction of the cell region CL. Therefore, it is possible to further improve the integration degree of a device and further decrease the overall area of the semiconductor chip SC.

FIG. 24 shows a sectional view of a switching transistor Tps having a p-channel MOS FET. The --switching transistor Tps is formed in an active region enclosed by a field insulating film 4 in an n-type well 2 and has a semiconductor region 20$p$1, a gate insulating film 20$pi$, and a gate electrode G.

The semiconductor region 20$p$1 has a low-concentration region 20$p$11 and a high-concentration region 20$p$12. The low-concentration region 20$p$11 and the high-concentration region 20$p$12 contain boron serving as a p-type impurity and the impurity concentration of the high-concentration region 20$p$12 is set to a value higher than that of the low-concentration region 20$p$11.

The gate insulating film 20$pi$ is made of, for example, silicon dioxide ($SiO_2$) and the gate electrode G is formed with a single layer film of low-resistance polysilicon or a laminated film obtained by depositing silicide such as tungsten silicide on low-resistance polysilicon.

FIG. 24 shows the gate electrode G divided into a plurality of gate electrodes. In fact, however, these gate electrodes G are electrically connected each other. A sidewall insulting film 21 made of, for example, $SiO_2$ is formed on the side face of the gate electrode G.

The switching transistor Tps is covered with a layer insulating film 22$a$. The layer insulating film 22$a$ is made of, for example, $SiO_2$ and a power-supply-voltage line Vdd1 of the first wiring layer is formed on the film 22$a$. The power-supply-voltage line Vdd1 is covered with a layer insulating film 22$b$. The layer insulating film 22$b$ is made of, for example, $SiO_2$ and power-supply-voltage lines Vdd2 and Vss2, the well feeding lines Vw12 and Vsu2, and the control signal lines Cw12 and Csu2 are formed on the film 22$b$. Moreover, the third-layer wiring is formed on the upper layer of the lines through a layer insulating film and the third-layer wiring is covered with a surface protection film.

FIG. 25 shows a sectional view of a switching transistor Tns having an n-channel MOS FET. The switching transistor Tns is formed in an active region enclosed by a field insulating film 4 in a p-type well 3 and has a semiconductor region 20$n$1, gate insulating film 20$ni$, and gate electrode G.

The semiconductor region 20$n$1 has a low-concentration region 20$n$11 and a high-concentration region 20$n$12. The low-concentration region 20$n$11 and high-concentration region 20$n$12 contain, for example, phosphorus or arsenic (As) serving as an n-type impurity and the impurity concentration of the high-concentration region 20$n$12 is set to a value higher than that of the low-concentration region 20$n$11.

The gate insulating film 20$ni$ is made of, for example, $SiO_2$ and the gate electrode G is formed with, for example, a single layer film of low-resistance polysilicon of a laminated film obtained by depositing silicide such as tungsten silicide on low-resistance polysilicon.

FIG. 25 shows the gate electrode G divided into a plurality of electrodes. In fact, however, these gate electrodes G are electrically connected each other and a sidewall insulating film 21 made of, for example, $SiO_2$ is formed on the side face of the gate electrode G.

The switching transistor Tns is covered with a layer insulating film 22$a$. The layer insulating film 22$a$ is made of, for example, $SiO_2$ and a power-supply-voltage line Vss1 of the first wiring layer is formed on the film 22$a$. The power-supply-voltage line Vss1 is covered with a layer insulating film 22$b$. The layer insulating film 22$b$ is made of, for example, $SiO_2$ and power-supply-voltage lines Vdd2 and Vss2, the well feeding lines Vw12 and Vsu2, and the control signal lines Cw12 and Csu2 are formed on the film 22$b$. The third-layer wiring is formed on the upper layer of the lines through a layer insulating film and moreover, the third-layer wiring is covered with a surface protection film.

Thus, this embodiment makes it possible to obtain the following advantages in addition to the advantages obtained from the preceding embodiment described in FIG. 1 and the like.

(1) It is possible to decrease the overall area occupied by switching transistors Tps and Tns in a semiconductor chip SC by arranging a set of switching transistors Tps and Tns on a plurality of logic gates.

(2) Because the switching transistors Tps and Tns are set immediately below the wiring arrangement region of power-supply-voltage lines Vdd2 and Vss2, it is possible to effectively use the principal plane of the semiconductor chip SC and prevent the area from increasing compared to the case of setting the switching transistors Tps and Tns in a region other than the wiring arrangement region.

(3) Because the switching transistors Tps and Tns are set immediately below the wiring arrangement region of the power-supply-voltage lines Vdd2 and Vss2, it is unnecessary to set control signal lines Cw1 and Csu extending in the arrangement direction of cell regions CL. Therefore, it is possible to decrease the area in the longitudinal direction of the cell region CL by a value equivalent to the area occupied by the control signal lines Cw1 and Csu.

(4) According to the above Items (1) to (3), it is possible to prevent a chip size from increasing due to addition of the switching transistors Tps and Tns.

(5) According to the above Items (1) to (3), it is possible to prevent the integration degree of an integrated circuit device from lowering due to addition of the switching transistors Tps and Tns.

Figure 26:
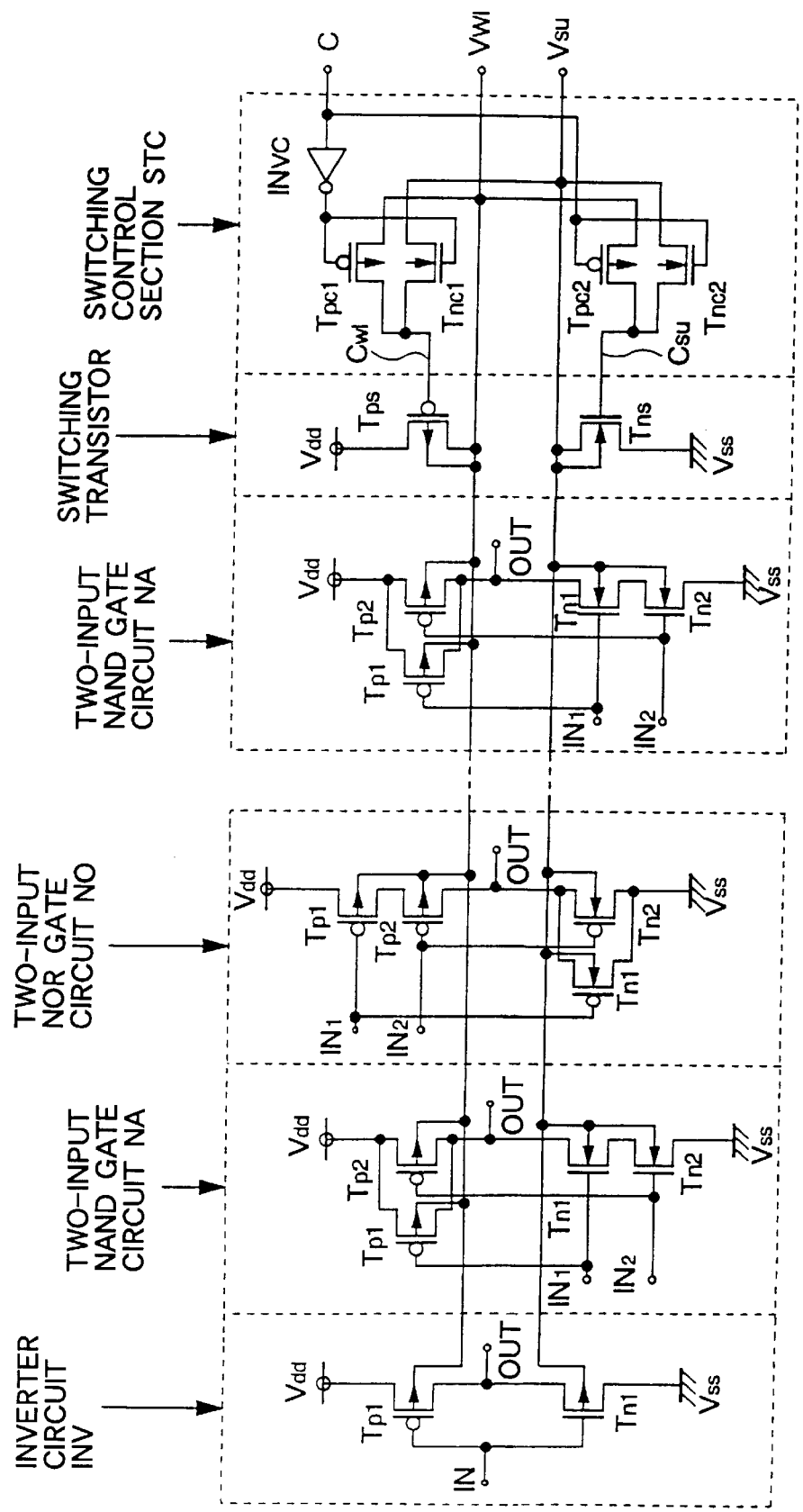
FIG. 26 is a circuit diagram of an essential portion of the semiconductor integrated circuit of still another embodiment of the present invention.

Then, still another embodiment of the present invention is described below by referring to FIG. 26. FIG. 26 shows a circuit diagram of an essential portion of the semiconductor integrated circuit of this embodiment of the present invention.

This embodiment has a structure almost same as the preceding embodiment, except that a switching control section STC for controlling operations of switching transistors Tps and Tns is set at the front stage of the switching transistors Tps and Tns.

Because the switching control section STC is used, this embodiment makes it possible to turn on/off the switching transistors Tps and Tns by only one control-signal wiring. This structure is realized by considering that, when either of control signal lines Cw1 and Csu is set to a high potential (High), the other one is set to a low potential (Low) and constituted as shown below.

The switching control section STC has transistors Tpc1, Tpc2, Tnc1, and Tnc2 and an inverter circuit INVc. The transistors Tpc1 and Tpc2 respectively have a p-channel MOS FET and the transistors Tnc1 and Tnc2 respectively have an n-channel MOS FET.

A control signal line C is electrically connected to the gate electrodes of the transistors Tpc1 and Tnc1 through the inverter circuit INVc and moreover, electrically directly connected to the gate electrodes of the transistors Tpc2 and Tnc2.

That is, this embodiment is constituted by dividing the control signal line C into two wiring paths and electrically connecting one of the wiring paths with a rear-stage circuit through the inverter circuit INVc and electrically directly connecting the other of them with the rear-stage circuit.

Thereby, this embodiment is constituted so as to generate two control signals different in potential from one control signal and transmit the two signals different in potential to the switching transistors Tps and Tns as control signals Cw1 and Csu.

One semiconductor regions of the transistors Tpc1 and Tnc1 are electrically connected to the gate electrode of the switching transistor Tps. Moreover, the other semiconductor region of the transistor Tpc1 is electrically connected with a well feeding line Vw1 and the other semiconductor region of the transistor Tnc1 is electrically connected with a well feeding line Vsu.

One semiconductor regions of the transistors Tpc2 and Tnc2 are electrically connected to the gate electrode of the switching transistor Tns. Moreover, the other semiconductor region of the transistor Tpc2 is electrically connected with the well feeding line Vw1 and the other semiconductor region of the transistor Tnc2 is electrically connected with the well feeding line Vsu.

Thus, this embodiment makes it possible to obtain the following advantage in addition to the advantages obtained from the preceding embodiment described in FIG. 20 and the like. That is, this embodiment makes it possible to turn on/off the switching transistors Tps and Tns by only one control signal line.

Then, still another embodiment of the present invention is described below by referring to FIGS. 27 and 28. In the case of this embodiment, a case is described in which the present invention is applied to an SRAM (Static Random Access Memory) or the like built in a computer such as a desk-top or lap-top personal computer.

Figure 27:
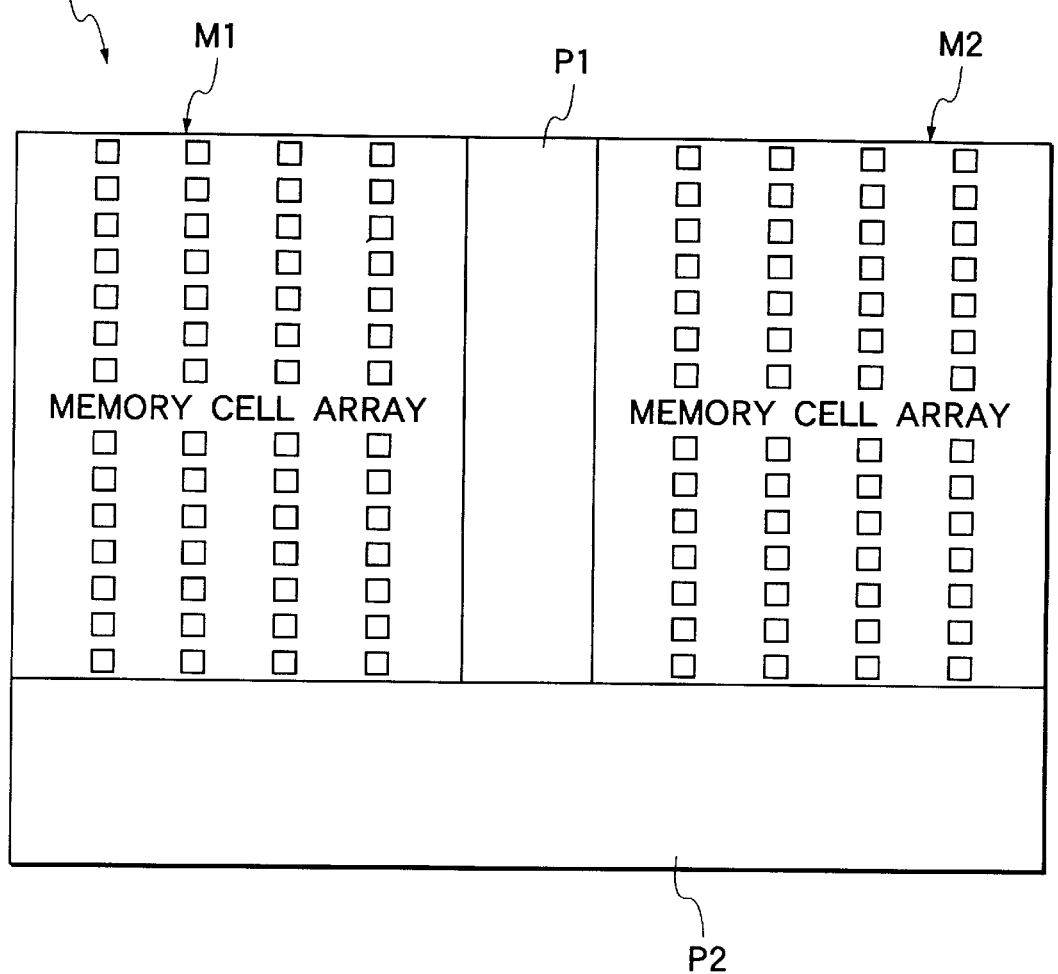
FIG. 27 is a top view of the semiconductor chip of the semiconductor integrated circuit of still another embodiment of the present invention.

FIG. 27 is a top view of a semiconductor chip SC having an SRAM. Peripheral circuit regions P1 and P2 are arranged at the center of a semiconductor chip SC and at the vicinity of one major side (lower major side in FIG. 27) of the chip SC.

A peripheral circuit such as a decoder circuit is formed in the central peripheral-circuit region P1. Moreover, a peripheral circuit such as a sense amplifier circuit or write circuit is formed in the peripheral circuit region P2 nearby the major side.

The switching transistors Tps and Tns (see FIG. 20, etc.) are also arranged in the peripheral circuit regions P1 and P2 similarly to the case of the preceding embodiment. As the arrangement method, it is possible to arrange one switching transistor every logic gate or one switching transistor every two or more logic gates. Therefore, it is also possible to obtain the advantages obtained from the preceding embodiment from peripheral circuits of a semiconductor integrated circuit.

Moreover, in the case of the semiconductor chip SC, memory cell arrays M1 and M2 are arranged at the both sides of the central peripheral-circuit region P1. A plurality of memory cells M1 and M2 to be mentioned later are regularly arranged in the vertical and horizontal directions in FIG. 27.

In the case of this embodiment, the switching transistors are also arranged in the memory cell arrays M1 and M2. The switching transistors are shown by a plurality of black quadrangles regularly arranged in the memory cell arrays M1 and M2.

However, it is not restricted to set a plurality of the switching transistors in each of the memory cell arrays M1 and M2. It is also possible to set one switching transistor in each of the memory cell arrays M1 and M2.

Moreover, the way of arranging switching transistors is not restricted to the way of arranging switching transistors in the vertical and horizontal directions in FIG. 27. It is also possible to arrange switching transistors only in the vertical or horizontal direction in FIG. 27.

Figure 28:
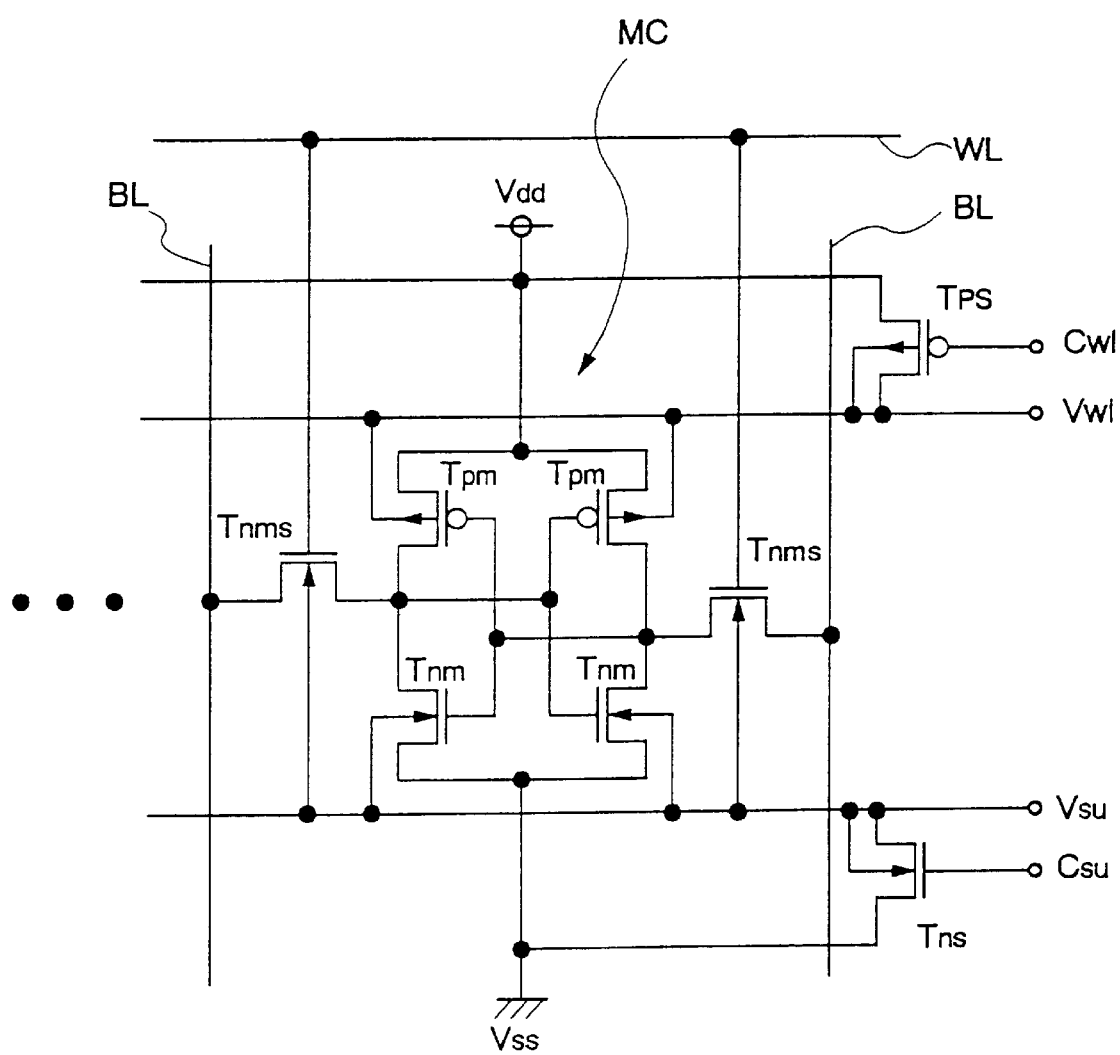
FIG. 28 is a circuit diagram of a memory cell of the semiconductor integrated circuit in FIG. 27.
Figure 29:
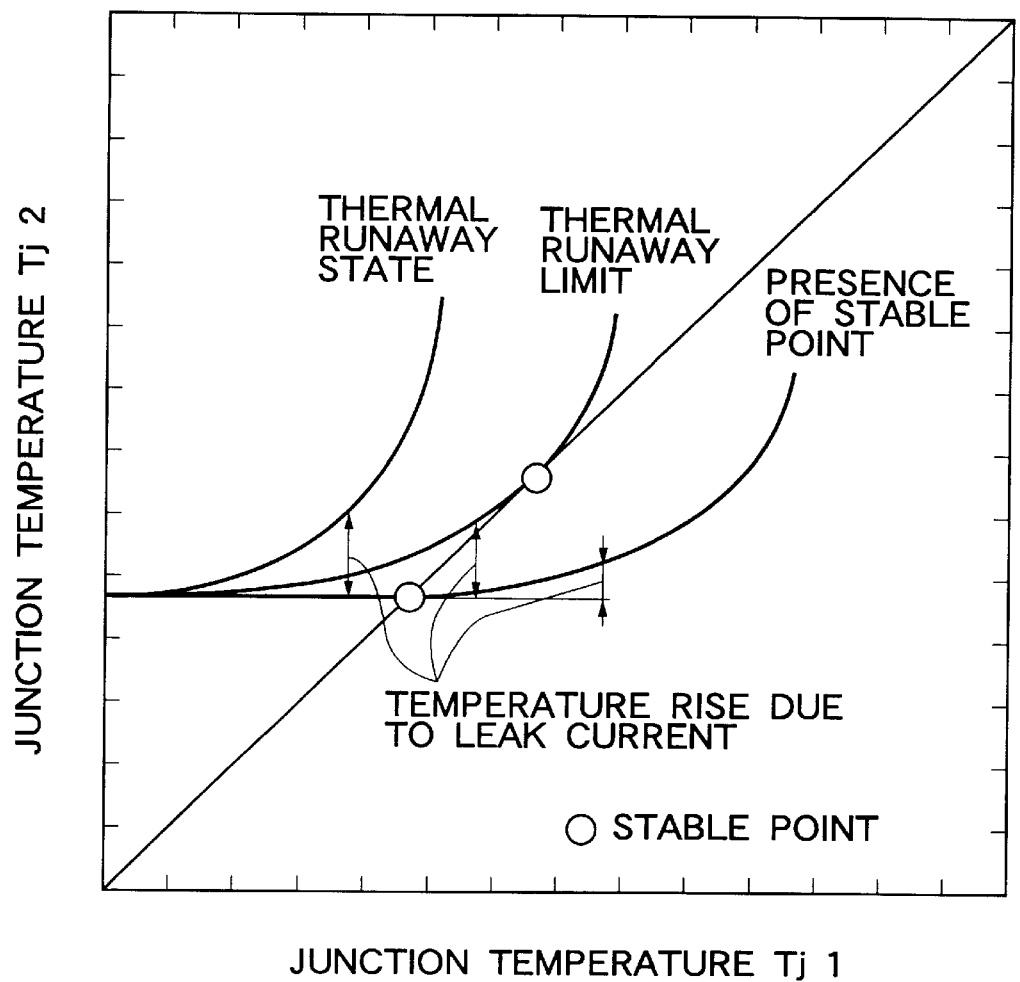
FIG. 29 is a graphic diagram for explaining the mechanism of thermal runaway under an aging test.

FIG. 28 shows a memory cell MC of the SRAM. The memory cell MC is constituted on the basis of, for example, a flip flop circuit obtained by making two-stage inverters having a CMOS structure intersect each other and connecting them each other and set nearby the intersection between a word line WL and a bit line BL.

Each inverter has transistors Tpm and Tnm and is constituted so that the input and the output of one inverter are electrically connected to the output and the input of the other inverter. Moreover, the transistor Tpm has a p-channel MOS FET and the transistor Tnm has an n-channel MOS FET.

The memory cell MC is electrically connected with a bit line BL through a transistor Tnms. The transistor Tnms has, for example, an n-channel MOS FET and its gate electrode is electrically connected with a word line WL. A plurality of memory cells MC of this type are regularly arranged on a memory cell array.

This embodiment has a structure capable of controlling the substrate potentials of the transistors Tpm and Tnm and the substrate potential of the transistor Tnms in the memory cell MC from the outside of the memory cell MC. That is, the structure is constituted as shown below.

Well feeding lines Vw1 and Vsu extending in parallel with a word line WL are formed on the memory cell arrays M1 and M2 (see FIG. 27) so as to hold the memory cell MC. The well feeding lines Vw1 and Vsu are electrically connected with the wells of the transistors Tpm, Tnm, and Tnms of the memory cell MC and electrically connected with power-supply-voltage lines Vdd and Vss respectively through the switching transistors Tps and Tns.

In the case of this embodiment, one switching transistor Tps and one switching transistor Tns are arranged on a plurality of memory cells MC. Thereby, it is possible to prevent a chip size from greatly increasing because of providing the memory cell arrays M1 and M2 for the switching transistors Tps and Tns. Moreover, it is possible to connect the well feeding lines Vw1 and Vsu with the well of each of the transistors Tpm, Tnm, and Tnms through a well or through a wiring as shown in FIG. 21 or 22.

In the case of this type of embodiment, when testing a semiconductor integrated circuit, the switching transistors Tps and Tns in the memory cell arrays M1 and M2 are turned off and a predetermined voltage is applied to the substrate potentials of the transistors Tpm and Tnm, and Tnms from the well feeding lines Vw1 and Vsu. Thereby, it is possible to avoid the problem of a leak current under a test and moreover avoid the problem of thermal runaway due to the leak current under an aging test.

Moreover, under the normal operation of a semiconductor integrated circuit, the switching transistors Tps and Tns are turned on by applying the power supply voltages Vdd and Vss to the control signal lines Cw1 and Csu respectively. Thereby, it is possible to control the fluctuation of substrate potentials of the transistors Tpm, Tnm, and Tnms, thereby preventing the fluctuation of latch-up phenomenon and operation speed due to the fluctuation of the substrate potentials, and securing the operation reliability of the semiconductor integrated circuit.

The invention made by the present inventor is specifically described above in accordance with embodiments. However, the present invention is not restricted to the embodiments. It is needless to say that various modifications can be made as long as they are not deviated from the gist of the present invention.

For example, it is possible to use a semiconductor substrate having the so-called SOI (Silicon on Insulator) structure in which a thin semiconductor layer for forming a device is formed on an insulating layer and realize a semiconductor integrated circuit having a circuit of a mode in which various semiconductor devices such as a MOS FET and a bipolar transistor are combined outside of a region for forming a CMOS FET and its fabrication art.

In the above description, a case is mainly described in which the invention made by the present inventor is applied to a logic gate circuit or a semiconductor integrated circuit of a single semiconductor memory circuit which is a utilization field backgrounding the invention. However, it is also possible to apply the present invention to a semiconductor integrated circuit art having a logic gate circuit and a semiconductor memory circuit on the same semiconductor substrate such as a one-chip microcomputer. Moreover, it is possible to apply the present invention to at least a semiconductor integrated circuit having a CMIS (Complimentary Metal Insulator Semiconductor) structure.

Industrial Applicability

As described above, a semiconductor integrated circuit of the present invention is preferably used for a semiconductor integrated circuit to be built in a mobile electronic unit, a small electronic unit such as a video camera, or a desk-top or lap-top personal computer.

What is claimed is:

1. A semiconductor integrated circuit device comprising:
   a first line to which a first voltage is supplied;
   a second line to which a second voltage, lower than the first voltage, is supplied;
   a third line;
   a fourth line;
   a p-channel MISFET having a source coupled to the first line, a drain and a gate, wherein a substrate potential of the p-channel MISFET is supplied from the third line;
   an n-channel MISFET having a source coupled to the second line, a drain coupled to the drain of the p-channel MISFET and a gate, wherein a substrate potential of the n-channel MISFET is supplied from the fourth line;
   a first switching MISFET of a p-channel type having a source coupled to the third line and a drain coupled to the first line, wherein the first switching MISFET is turned on in a first operation mode in which the substrate potential of the p-channel MISFET is determined based on the first voltage being applied on the first line, and wherein the first switching MISFET is turned off in a second operation mode in which the substrate potential of the p-channel MISFET is determined based on a third voltage, higher than the first voltage, being applied to the third line,
   a second switching MISFET of an n-channel type having a source coupled to the fourth line and a drain coupled to the second line, wherein the second switching MISFET is turned on in the first operation mode in which the substrate potential of the n-channel MISFET is determined based on the second voltage being supplied to the second line, and wherein the second switching MISFET is turned off in the second operation mode in which the substrate potential of the n-channel MISFET is determined based on a fourth voltage, lower than the second voltage, being applied on the fourth line.

2. A semiconductor integrated circuit device according to claim 1,
   wherein the first operation mode is a normal operation mode, and
   wherein the second operation mode is a test mode.

3. A semiconductor integrated circuit device according to claim 2,
   wherein the third voltage and the fourth voltage are externally supplied from outside of the semiconductor integrated circuit.

4. A semiconductor integrated circuit device according to claim 1, further comprising:
   a control circuit coupled to gates of the first and the second switching MISFETs and being responsive to a control signal for controlling to switching operation of the first and the second switching MISFETs such that the first and second switching MISFETs are turned on or turned off in accordance with a signal level of the control signal.

5. A semiconductor integrated circuit device according to claim 1, further comprising:
   a second p-channel MISFET having a source coupled to the first line, a drain and a gate, wherein a substrate potential of the second p-channel MISFET is supplied from the third line; and
   an second n-channel MISFET having a source coupled to the second line, a drain coupled to the drain of the second n-channel MISFET and a gate, wherein a substrate potential of the second n-channel MISFET is supplied from the fourth line,
   wherein the first n-channel MISFET and the first p-channel MISFET constitute one logic gate, and
   wherein the second n-channel MISFET and the second p-channel MISFET constitute another logic gate.

6. A semiconductor integrated circuit device having a normal mode and a test mode, comprising:
   a first line to which a first voltage is supplied;
   a second line to which a second voltage, lower than the first voltage, is supplied;
   a third line;
   a fourth line;
   a plurality of logic gates, each including:
      a p-channel MISFET having a source coupled to the first line, a drain and a gate, wherein a substrate potential of the p-channel MISFET is determined based on a voltage on the third line; and an n-channel MISFET having a source coupled to the second line, a drain coupled to the drain of the p-channel MISFET and a gate coupled to the gate of the n-channel MISFET, wherein a substrate potential of the n-channel MISFET is determined based on a voltage on the fourth line, wherein the voltage on the third line is approximately the same voltage to the first voltage in the normal mode and the voltage on the third line is a voltage larger than the first voltage on the test mode, such that a threshold voltage of the p-channel MISFET in the test mode is larger than that of the p-channel MISFET in the normal mode, and wherein the voltage on the fourth line is approximately the same voltage to the second voltage in the normal mode and the voltage on the third line is a voltage smaller than the second voltage in the test mode, such that a threshold voltage of the n-channel MISFET in the test mode is larger than that of the n-channel MISFET in the normal mode;

a p-channel switching MISFET coupled between the first line and the third line, wherein the p-channel switching MISFET is turned on in the normal mode and is turned off in the test mode; and an n-channel switching MISFET coupled between the second line and the fourth line, wherein the n-channel switching MISFET is turned on in the normal mode and is turned off in the test mode.

7. A semiconductor integrated circuit device according to claim 6, wherein the voltage on the third line and the voltage on the fourth line are externally supplied from outside of the semiconductor integrated circuit, in the test mode.

8. A semiconductor integrated circuit device according to claim 6, wherein the p-channel switching MISFET has a source coupled to the third line, a drain coupled to the first line and a gate to which a first signal is applied, and wherein the n-channel switching MISFET has a source coupled to the fourth line, a drain coupled to the second line and a gate to which a second signal is applied.

9. A semiconductor integrated circuit device according to claim 8, further comprising:

a control circuit coupled to the gates of the first and the second switching MISFETs and for controlling switching operations of the first and the second switching MISFETs by providing the first and the second signals in response to a control-signal at an input thereof.

10. A semiconductor integrated circuit device comprising:

a first line supplying a first voltage;

a second line supplying a second voltage, lower than the first voltage;

a third line;

a fourth line;

a semiconductor substrate having an n-type well coupled to third line and a p-type well coupled to the fourth line, a p-channel MISFET formed in the n-type well and having a source coupled to the first line, a drain and a gate;

an n-channel MISFET formed in the p-type well and having a source coupled to the second line, a drain coupled to the drain of the p-channel MISFET and a gate;

a p-channel switching MISFET coupled between the first line and the third line, wherein the p-channel switching MISFET is turned on in a first operation mode in which the potential of the n-type well is determined by the first voltage on the first line, and wherein the p-channel switching MISFET is turned off in a second operation mode in which the potential of the n-type well is determined by a third voltage, higher than the first voltage on the third line, which third voltage is applied to the third line from outside of the semiconductor integrated circuit device in the second mode, and an n-channel switching MISFET coupled between the second line and the fourth line, wherein the n-channel switching MISFET is turned on in the first operation mode in which the potential of the p-type well is determined by the second voltage on the second line, and wherein the n-channel switching MISFET is turned off in the second operation mode in which the potential of the p-type well is determined by a fourth voltage, lower than the second voltage on the fourth line, which fourth voltage is applied to the fourth line from outside of the semiconductor integrated circuit device in the second mode.

11. A semiconductor integrated circuit device according to claim 10, wherein the p-channel switching MISFET has a source coupled to the third line and a drain coupled to the first line, and wherein the n-channel switching MISFET has a source coupled to the fourth line and a drain coupled to the second line.

12. A semiconductor integrated circuit device according to claim 11, wherein the p-channel switching MISFET is formed in the n-type well, and wherein the A-channel switching MISFET is formed in the p-type well.

13. a semiconductor integrated circuit device according to claim 12, wherein the first operation mode is a normal operation mode, and wherein the second operation mode is a test mode.

* * * * *